United States Patent
Brogle et al.

(10) Patent No.: US 11,574,906 B2
(45) Date of Patent: Feb. 7, 2023

(54) MONOLITHIC MULTI-I REGION DIODE SWITCHES

(71) Applicant: MACOM Technology Solutions Holdings, Inc., Lowell, MA (US)

(72) Inventors: James Joseph Brogle, Merrimac, MA (US); Joseph Gerard Bukowski, Derry, NH (US); Margaret Mary Barter, Lowell, MA (US); Timothy Edward Boles, Tyngsboro, MA (US)

(73) Assignee: MACOM TECHNOLOGY SOLUTIONS HOLDINGS, INC., Lowell, MA (US)

( * ) Notice: Subject to any disclaimer, the term of this patent is extended or adjusted under 35 U.S.C. 154(b) by 0 days.

(21) Appl. No.: 16/805,154

(22) Filed: Feb. 28, 2020

(65) Prior Publication Data
US 2020/0279844 A1 Sep. 3, 2020

Related U.S. Application Data

(60) Provisional application No. 62/811,734, filed on Feb. 28, 2019.

(51) Int. Cl.
*H01L 27/06* (2006.01)
*H01L 21/822* (2006.01)
(Continued)

(52) U.S. Cl.
CPC ........ *H01L 27/0676* (2013.01); *H01L 21/822* (2013.01); *H01L 29/00* (2013.01);
(Continued)

(58) Field of Classification Search
CPC . H01L 27/0676; H01L 21/822; H01L 29/868; H01L 29/00; H01L 31/075;
(Continued)

(56) References Cited

U.S. PATENT DOCUMENTS 3,217,212 A 11/1965 Ryder
4,476,481 A 10/1984 Iesaka et al.
(Continued)

FOREIGN PATENT DOCUMENTS

DE 19726070 12/1998
EP 1605508 A2 12/2005
(Continued)

OTHER PUBLICATIONS

International Search Report and Written Opinion dated Jun. 8, 2020 for PCT Patent Application No. PCT/JS2020/017945.
(Continued)

*Primary Examiner* — Shouxiang Hu
(74) *Attorney, Agent, or Firm* — Perilla Knox & Hildebrandt LLP; Jason M. Perilla

(57) ABSTRACT

A number of monolithic multi-throw diode switch structures are described. The monolithic multi-throw diode switches can include a hybrid arrangement of diodes with different intrinsic regions, all formed over the same semiconductor substrate. In one example, two PIN diodes in a monolithic multi-throw diode switch have different intrinsic region thicknesses. The first PIN diode has a thinner intrinsic region, and the second PIN diode has a thicker intrinsic region. This configuration allows for both the thin intrinsic region PIN diode and the thick intrinsic region PIN diode to be individually optimized. As one example, for a switch functioning in a dedicated transmit/receive mode, the first transmit PIN diode can have a thicker intrinsic region than the second receive PIN diode to maximize power handling for the transmit arm and maximize receive sensitivity and insertion loss in the receive arm.

20 Claims, 10 Drawing Sheets

(51) Int. Cl.
*H03K 17/74* (2006.01)
*H01L 29/205* (2006.01)
*H01L 29/00* (2006.01)
*H01L 31/075* (2012.01)

(52) U.S. Cl.
CPC .......... *H01L 29/205* (2013.01); *H01L 31/075* (2013.01); *H03K 17/74* (2013.01)

(58) Field of Classification Search
CPC ..... H01L 29/861; H01L 29/205; H01L 29/93; H03K 17/74; H03K 17/76; H01P 1/15
See application file for complete search history.

(56) References Cited

U.S. PATENT DOCUMENTS

| | | | |
|---|---|---|---|
| 4,777,490 A * | 10/1988 | Sharma | H01Q 21/0093 343/754 |
| 4,843,358 A | 6/1989 | Meise et al. | |
| 5,241,195 A | 8/1993 | Tu et al. | |
| 6,552,626 B2 * | 4/2003 | Sharpe | H01P 1/15 455/78 |
| 6,821,860 B1 | 11/2004 | Behammer | |
| 7,129,805 B2 * | 10/2006 | Marion | H01P 1/15 333/103 |
| 7,755,173 B2 | 7/2010 | Mondi et al. | |
| 11,127,737 B2 * | 9/2021 | Brogle | H01L 23/66 |
| 2004/0135235 A1 | 7/2004 | Poveda | |
| 2005/0077577 A1 | 4/2005 | Manna et al. | |
| 2005/0242412 A1 | 11/2005 | Gabl | |
| 2007/0077725 A1 | 4/2007 | Wilson et al. | |
| 2007/0166942 A1 | 7/2007 | Cogan et al. | |
| 2008/0296587 A1 | 12/2008 | Yamamoto et al. | |
| 2009/0230516 A1 | 9/2009 | Goodrich et al. | |
| 2010/0097120 A1 | 4/2010 | Bizien et al. | |
| 2010/0117725 A1 * | 5/2010 | Mauder | H01L 29/861 257/656 |
| 2010/0164068 A1 | 7/2010 | Pennock | |
| 2010/0208517 A1 | 8/2010 | Lo et al. | |
| 2014/0070369 A1 | 3/2014 | Kitamura | |
| 2016/0099306 A1 | 4/2016 | Cheng | |
| 2020/0127023 A1 | 4/2020 | Geske et al. | |
| 2021/0343706 A1 | 11/2021 | Brogle et al. | |
| 2021/0399143 A1 * | 12/2021 | Boles | H01L 29/868 |

FOREIGN PATENT DOCUMENTS

| | | |
|---|---|---|
| JP | S57128983 A | 8/1982 |
| WO | 2020117679 A1 | 6/2020 |
| WO | 20200167961 A1 | 8/2020 |
| WO | 2020176878 A1 | 9/2020 |

OTHER PUBLICATIONS

International Search Report and Written Opinion dated May 28, 2020 for PCT Patent Application No. PCT/JS2020/020471.

Rao, M. V.; et al. "Characteristics of fully implanted GaAs vertical PIN diodes" Solid-State Electronics 41.1 (1997): 47-50.

Brogle, James J.; et al. "A 50 watt monolithic surface-mount series-shunt pin diode switch with integrated thermal sink." 2010 Asia-Pacific Microwave Conference. IEEE, 2010.

Boles, Timothy; et al. "Monolithic High Power 300 Watt, S-Band, HMIC PIN Diode Limiter." 2019 IEEE International Conference on Microwaves, Antennas, Communications and Electronic Systems (COMCAS). IEEE, 2019.

International Search Report and Written Opinion for PCT/US2019/064018 dated Feb. 27, 2020.

Non-Final Office Action for U.S. Appl. No. 17/289,990 dated Nov. 9, 2022.

* cited by examiner

MONOLITHIC MULTI-I REGION DIODE SWITCHES

CROSS-REFERENCE TO RELATED APPLICATIONS

This application claims the benefit of priority to U.S. Provisional Application No. 62/811,734, filed Feb. 28, 2019, titled "MONOLITHIC MULTI-THROW MULTI-I REGION PIN DIODE SWITCHES," the entire contents of which is hereby incorporated herein by reference.

BACKGROUND

A PIN (P-type-Intrinsic-N-type) diode is a diode with an undoped intrinsic semiconductor region between a P-type semiconductor region and an N-type semiconductor region. Traditionally, PIN diode devices have been fabricated by the growth, deposition, or other placement of layers vertically on a substrate. A PIN diode is a diode with an undoped intrinsic semiconductor region between a P-type semiconductor region and an N-type semiconductor region. The P-type and N-type regions are typically heavily doped because they are used for ohmic contacts. The inclusion of the intrinsic region between the P-type and N-type regions is in contrast to an ordinary PN diode, which does not include an intrinsic region.

The top, P-type region is the anode of the PIN diode, and the bottom, N-type region or substrate is the cathode of the PIN diode. When unbiased, the PIN diode is in a high impedance state and can be represented as a capacitor, the capacitance of which is given by $C=A_{Anode}D_{si}E_o/T$, where: $A_{Anode}$ is the area of the anode, $D_{si}$ is the dielectric constant of the intrinsic silicon, $E_o$ is the permittivity of free space, and T is the distance between the anode and cathode.

If a positive voltage larger than a threshold value is applied to the anode with respect to the cathode, a current will flow through the PIN diode and the impedance will decrease. A PIN diode in a forward biased state can be represented as a resistor whose value decreases to a minimum value as the current through the PIN diode increases. The bias to change the PIN diode from the high impedance (off) state to the low impedance (on) state can be DC or AC. In the case of an AC voltage, the magnitude must be greater than the threshold value and the duration of the positive voltage must be longer than the transit time of carriers across the intrinsic region.

SUMMARY

A number of monolithic diode switches for applications in radio frequency circuits are described. In one example, a monolithic multi-throw diode switch includes a common port, a first port, and a second port. The switch also includes a first PIN diode comprising a first P-type region formed to a first depth into an intrinsic layer such the first PIN diode comprises a first effective intrinsic region of a first thickness, where the first PIN diode is electrically coupled to a node between the common port and the first port. The switch also includes a second PIN diode comprising a second P-type region formed to a second depth into the intrinsic layer such the second PIN diode comprises a second effective intrinsic region of a second thickness, where the second PIN diode is electrically coupled to a node between the common port and the second port. The switch also includes a first bias network for bias control of the first PIN diode, and a second bias network for bias control of the second PIN diode.

In one aspect of the embodiments, the first thickness of the first PIN diode is greater than the second thickness of the second PIN diode. This configuration allows for both the thinner intrinsic region PIN diode and the thicker intrinsic region PIN diode to be individually optimized. As one example, for a switch functioning in a dedicated transmit/receive mode, the first transmit PIN diode can have a thicker intrinsic region than the second receive PIN diode to maximize power handling for the transmit arm and maximize receive sensitivity and insertion loss in the receive arm.

In another aspect of the embodiments, the switch can also include at least one capacitor and at least one inductor formed over the intrinsic layer as part of the monolithic multi-throw diode switch. In other examples, the switch can also include at least one transmission line formed over the intrinsic layer as part of the monolithic multi-throw diode switch. These additional circuit elements, along with metal layers to interconnect all elements of the switch, can be realized monolithically to improve the overall reliability, circuit ruggedness, radio frequency (RF) performance, circuit size, and overall cost of the switch as compared to discrete solutions.

As examples of the monolithic diode switch topologies described herein, the first PIN diode can be series-connected in the node between the common port and the first port, and the second PIN diode can be series-connected in the node between the common port and the second port. In another case, the first PIN diode can be shunt-connected from the node between the common port and the first port to ground, and the second PIN diode can be shunt-connected from the node between the common port and the second port to ground. In still another case, the first PIN diode can be series-connected in the node between the common port and the first port, and the second PIN diode can be shunt-connected from a cathode of the first PIN diode to ground. Other topologies are described herein.

In other aspects of the embodiments, the monolithic diode switch can also include a dielectric layer over the intrinsic layer, where the dielectric layer includes a plurality of openings, the first P-type region is formed through a first opening among the plurality of openings, and the second P-type region is formed through a second opening among the plurality of openings. The first width of the first opening can be different than a second width of the second opening.

In another embodiment, a method of manufacture of a monolithic multi-throw diode switch is described. The method includes providing an intrinsic layer on an N-type semiconductor substrate, implanting a first P-type region to a first depth into the intrinsic layer to form a first PIN diode comprising a first effective intrinsic region of a first thickness, implanting a second P-type region to a second depth into the intrinsic layer to form a second PIN diode comprising a second effective intrinsic region of a second thickness, and forming at least one metal layer over the intrinsic layer to electrically couple the first PIN diode to a node between a common port and a first port of the switch and to electrically couple the second PIN diode to a node between the common port and a second port of the switch. In one aspect of the embodiment, the first thickness is greater than the second thickness. The method can also include forming at least one capacitor and at least one inductor over the intrinsic layer as part of the monolithic multi-throw diode switch.

The method can also include forming an insulating layer on the intrinsic layer, and forming a first opening in an insulating layer. In that case, implanting the first P-type region can include implanting the first P-type region through the first opening. After implanting the first P-type region, the method can also include forming a second opening in the insulating layer. In that case, implanting the second P-type region can include implanting the second P-type region through the second opening. In this example, a first width of the first opening is different than a second width of the second opening.

BRIEF DESCRIPTION OF THE DRAWINGS

Aspects of the present disclosure can be better understood with reference to the following drawings. It is noted that the elements in the drawings are not necessarily to scale, with emphasis instead being placed upon clearly illustrating the principles of the embodiments. In the drawings, like reference numerals designate like or corresponding, but not necessarily the same, elements throughout the several views.

DETAILED DESCRIPTION

Figure 1A:
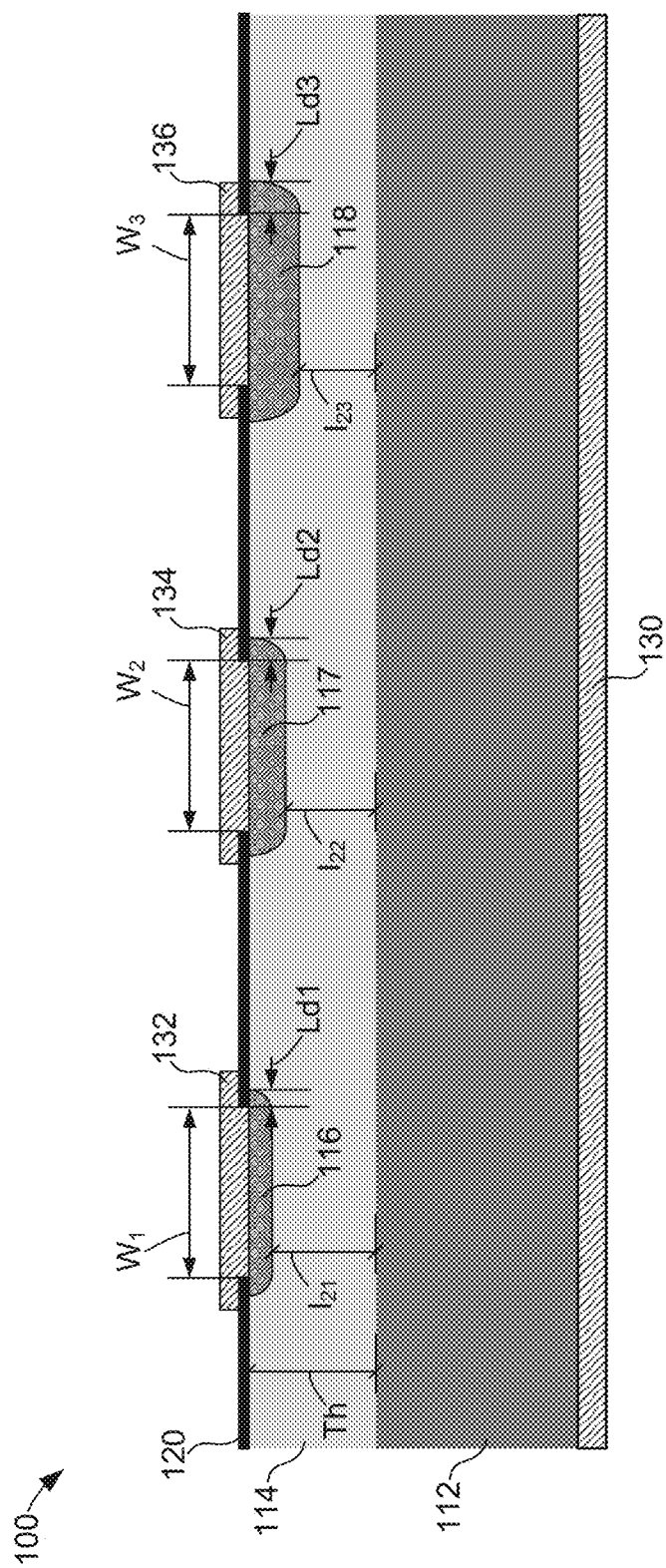
FIG. 1A illustrates an example vertical planar silicon PIN diode structure with multi-thickness intrinsic regions according to various embodiments described herein.

Discrete PIN diodes are available in various forms, such as in bare or discrete die form, in plastic packages, and in ceramic packages of various types (e.g., surface mount, pill packages, etc.). PIN diodes in ceramic packages are particularly suitable for waveguide, coaxial, and surface mount applications, while PIN diodes in bare die form are often used for chip and wire high frequency microwave applications.

However, many of the current design and fabrication techniques for PIN diodes are limited. These techniques cannot be used to form different PIN diode structures, such as PIN diodes with different intrinsic region thicknesses, on a single silicon wafer. Thus, the current design of multi-throw RF switches generally requires the use of a number of discrete PIN diodes, each formed from a different silicon wafer, to incorporate PIN diodes with different intrinsic region thicknesses into one multi-throw switch. These switches are formed by using a hybrid assembly of individual discrete PIN diodes mounted on a PCB or another multi-chip module format. The number of stages and specific arrangement of PIN diodes in each stage determines the low level RF turn-on, the flat leakage, and the power handling/limiting and frequency response. A monolithic (i.e., integrated silicon) solution would improve the overall reliability, circuit ruggedness, RF performance, circuit size, and overall cost of multi-throw switches and other circuits as compared to discrete solutions.

As noted above, the current design and fabrication techniques for planar PIN diodes limit the types of diode structures that can be realized across a silicon wafer. For example, one fabrication technique for PIN diodes limits all the PIN diodes fabricated on a silicon wafer to each have the same "I" (i.e., intrinsic) region thickness. This is a result of several factors. First, PIN diodes are almost exclusively vertical structures, where a metallurgical "I" region is grown or wafer bonded over a highly doped N-type substrate, where he N-type substrate forms the N+cathode. The P+anode is then formed in the "I" region either by ion implantation or solid state deposition of a P-type dopant, followed by a heat cycle to activate and diffuse the P-type dopant to a specie depth into the "I" region. The junction depth of the P+anode after the thermal drive cycle will result in a reduction of the metallurgical "I" region thickness resulting in an effective or electrical "I" region thickness. This approach results in a wafer and subsequent derivative die having an "I" region of only one thickness. In other words, every PIN diode formed through this approach has the same "I" region thickness. For many high frequency circuit functions, however, it is necessary to have PIN diodes with multiple "I" region thicknesses, to achieve a control response over a desired frequency range, for example, and for other operating characteristics.

Another example fabrication technique for PIN diodes is described in U.S. Pat. No. 7,868,428. U.S. Pat. No. 7,868,428 describes the formation of multiple thickness "I" regions on a single wafer using a photolithographic process and lateral gaps between separate P+ and N+ regions. The P+ and N+ regions are ion implanted/diffused into an undoped intrinsic silicon wafer or intrinsic region of a wafer. The difficulty with this lateral surface controlled approach is the fact that relatively high surface leakage, which is in general at least 10 times the leakage levels observed for bulk, vertical devices, produces a very inconsistent turn-on characteristic.

Due in part to the limitations outlined above, the current design of multi-throw switches generally requires the use of a number of discrete PIN diodes, each formed from a different silicon wafer, to incorporate PIN diodes with different "I" region thicknesses into one multi-throw switch. These switches use a hybrid assembly of individual discrete PIN diodes mounted on a printed circuit board (PCB), for example, or another multi-chip module format. The specific arrangement of PIN diodes in each arm of a multi-throw switch determines the insertion loss, isolation, incident power handling, sensitivity, linearity, and RF distortion of each switch arm. A monolithic (i.e., integrated silicon) solution would improve the overall reliability, circuit ruggedness, performance, size, and overall cost of multi-throw switches as compared to discrete solutions.

Also due to the limitations outlined above, monolithic multi-throw switches typically incorporate PIN diodes having the same "I" region thickness for all PIN diodes, regardless of the intended functional capability of each switch arm. Presently, monolithic multi-throw HMIC switches use only one "I" region thickness for the PIN diodes in each switch arm. This monolithic HIMC approach results in a compromise solution relative to insertion loss, isolation, power handling, linearity, and distortion, because it does not account for the specific functional responses of different switch arms. For example, the primary design concerns for a transmit arm in a transmit/receive (T/R) switch include incident power handling, isolation, linearity, and distortion, while the receive arm needs to be optimized for insertion loss and sensitivity. These separate RF performance requirements require PIN diodes having different intrinsic "I" region thicknesses.

The concepts described herein achieve fully monolithic solutions for HMIC multi-throw switches using multiple, different "I" region thicknesses. The solution allows for individual optimization for insertion loss, isolation, and power handling for each switch arm/termination. The concepts can be relied upon to significantly reduce the size and improve the RF performance of switches as compared to hybrid discrete solutions.

First, a monolithic, vertical, planar semiconductor structure with a number PIN diodes having different "I" region thicknesses is described. The semiconductor structure includes an N-type silicon substrate, an intrinsic layer formed on the N-type silicon substrate, and a dielectric layer formed on the intrinsic layer. A number of openings are formed in the dielectric layer. Multiple anodes are sequentially formed into the intrinsic layer through the openings formed in the dielectric layer. For example, a first P-type region is formed through a first one the openings to a first depth into the intrinsic layer, and a second P-type region is formed through a second one of the openings to a second depth into the intrinsic layer. Additional P-type regions can be formed to other depths in the intrinsic layer. When these PIN diodes of different intrinsic regions are used in the design of multi-throw switches, the switches exhibit improved reliability, ruggedness, RF performance, size, and cost as compared to the current discrete solutions.

Additionally, a number of different monolithic, multi-throw PIN diode switches are described. The monolithic multi-throw diode switches can include a hybrid arrangement of diodes with different intrinsic regions, all formed over the same semiconductor substrate. In one example, two PIN diodes in a monolithic multi-throw diode switch have different intrinsic region thicknesses. The first PIN diode has a thinner intrinsic region, and the second PIN diode has a thicker intrinsic region. This configuration allows for both the thin intrinsic region PIN diode and the thick intrinsic region PIN diode to be individually optimized. As one example, for a switch functioning in a dedicated transmit/receive mode, the first transmit PIN diode can have a thicker intrinsic region than the second receive PIN diode to maximize power handling for the transmit arm and maximize receive sensitivity and insertion loss in the receive arm. FIG. 1A illustrates an example vertical planar silicon PIN diode structure 100 with multi-thickness intrinsic regions according to various embodiments described herein. The PIN diode structure 100, including three PIN diode devices, is illustrated as a representative example in FIG. 1A. Additional PIN diode devices (i.e., more than three) can be formed as part of the PIN diode structure 100. The shapes, sizes, and relative sizes of the various layers of the PIN diode structure 100 are not necessarily drawn to scale in FIG. 1A. The layers shown in FIG. 1A are not exhaustive, and the PIN diode structure 100 can include other layers and elements not separately illustrated. The PIN diode structure 100 can also be formed as part of a larger integrated circuit device in combination with other diodes, capacitors, inductors, resistors, and layers of metal to electrically interconnect the circuit elements together to form switches, limiters, and other devices as described below. Additionally, a number of NIP diode devices can also be formed to have a structure similar to the structure shown in FIG. 1A, by interchanging the P-type and N-type dopants described below.

The PIN diode structure 100 includes an N-type semiconductor substrate 112, an intrinsic layer 114, a first P-type region 116 formed in the intrinsic layer 114, a second P-type region 117 formed in the intrinsic layer 114, and a third P-type region 118 formed in the intrinsic layer 114. The P-type regions 116-118 are formed through openings of widths $W_1$-$W_3$, respectively, in an insulating layer 120 as described in further detail below. The N-type semiconductor substrate 112 forms a cathode of the PIN diode structure 100. The P-type regions 116-118 form first, second, and third anodes, respectively, of the PIN diode structure 100. The PIN diode structure 100 also includes a cathode contact 130 formed on the N-type semiconductor substrate 112, a first anode contact 132 formed over the first P-type region 116, a second anode contact 134 formed over the second P-type region 117, and a third anode contact 136 formed over the third P-type region 118.

The PIN diode structure 100 shown in FIG. 1A includes three PIN diode devices, but the PIN diode structure 100 can be formed to include any suitable number of PIN diode devices. Electrical contact to the first PIN diode device is available between the cathode contact 130 and the first anode contact 132. Electrical contact to the second PIN diode device is available between the cathode contact 130 and the second anode contact 134. Electrical contact to the third PIN diode device is available between the cathode contact 130 and the third anode contact 136.

To form the PIN diode structure 100 shown in FIG. 1A, the P-type anode regions 116-118 can be formed sequentially, or in turn, in the intrinsic layer 114 as described below with reference to FIG. 1B. The P-type anode region 116 is diffused to the least extent into the intrinsic layer 114, the P-type anode region 117 diffused to a greater extent into the intrinsic layer 114, and the P-type anode region 118 is diffused the greatest extent into the intrinsic layer 114. Thus, the effective intrinsic region $I_{21}$ under the P-type anode region 116 is larger than the effective intrinsic region 122 under the P-type anode region 117, and the effective intrinsic region 122 is larger than the effective intrinsic region 123 under the P-type anode region 118. In one example, the effective intrinsic region 121 can be between about 20-23 µm, the effective intrinsic region $I_{22}$ can be about 12 µm, and the effective intrinsic region 123 can be about 5 µm, although other ranges are within the scope of the embodiments.

The extent of the lateral diffusions, Ld1, Ld2, and Ld3 of the P-type regions 116-118 under the insulating layer 120 also vary, with the lateral diffusion Ld1 being the smallest and the lateral diffusion Ld3 being the largest. In some cases, to control the capacitance and the high-frequency characteristics of each individual PIN diode, the widths $W_1$-$W_3$ of the openings formed in the insulating layer 120 can vary as compared to each other. For example, $W_3$ can be smaller than $W_2$, and $W_2$ can be smaller than $W_1$.

Figure 1B:
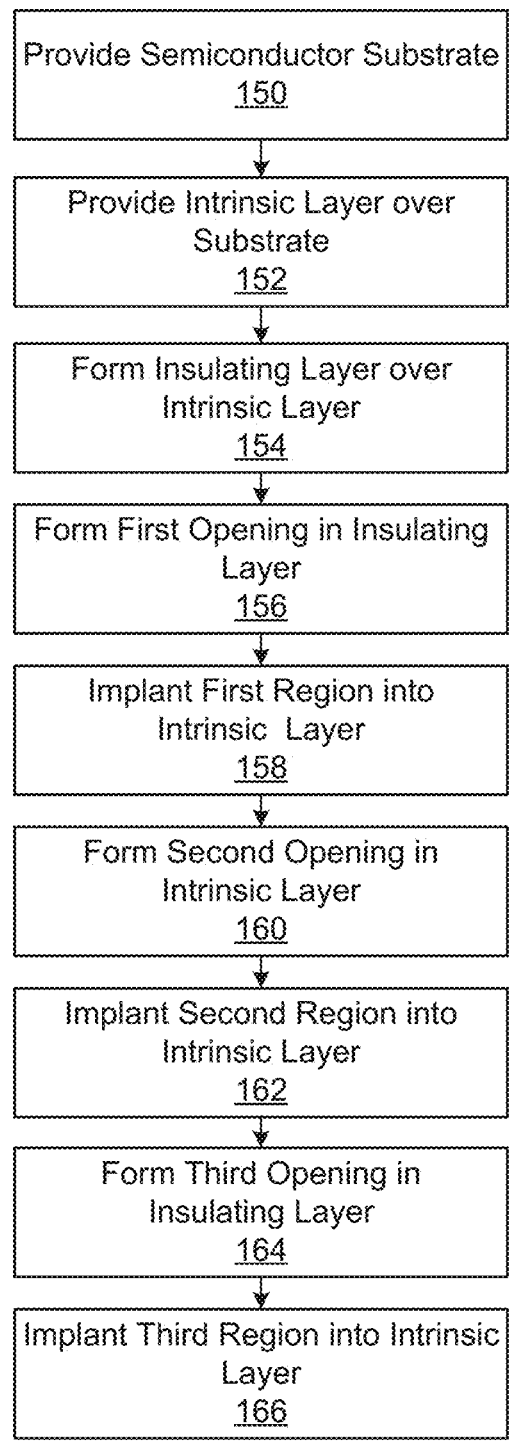
FIG. 1B illustrates an example method of forming the PIN diode structure shown in FIG. 1A according to various embodiments described herein.

FIG. 1B illustrates an example method of forming the PIN diode structure 100 shown in FIG. 1A. Alternatively, a NIP diode structure can also be formed using the method, by interchanging the P-type and N-type dopants, as described below. Although the method diagram illustrates a specific order in FIG. 1B, the order or the steps can differ from that which is depicted. For example, an order of two or more steps can be scrambled relative to the order shown in some cases. Also, two or more steps shown in succession can be performed, at least in part, at the same time. In some cases, one or more of the steps can be skipped or omitted. In other cases, additional steps not shown in FIG. 1B can be relied upon, such as steps among or after the steps shown in FIG. 1B.

At step 150, the process includes providing or forming the N-type semiconductor substrate 112. The semiconductor substrate 112 can be formed by melting and mixing silicon with Arsenic, among other suitable dopants, to a concentration of about $2 \times 10^{19}$ Arsenic atoms/cm$^3$ and then solidifying the mixture, although the substrate 112 can be formed by other methods to other charge carrier concentrations. Additionally or alternatively, step 150 can include providing or sourcing the semiconductor substrate 112, such as when the semiconductor substrate 112 is sourced or purchased from a manufacturer. In another example, a NIP diode structure can be formed using the process shown in FIG. 1B. In that case, the process would include forming a P-type semiconductor substrate at step 150 using Boron, for example, or another P-type dopant rather than Arsenic.

At step 152, the process includes providing the intrinsic layer 114 over the semiconductor substrate 112. The intrinsic layer 114 can be provided or formed on the semiconductor substrate 112 using deposition, wafer bonding, or another suitable technique. The intrinsic layer 14 can have the thickness "Th" of between about 7-100 μm as shown in FIG. 1A, in some cases, although the intrinsic layer 14 can be thicker (e.g., up to about 400 μm) in other cases.

At step 154, the process includes forming the insulating layer 120 over the intrinsic layer 114. The insulating layer 120 can be formed over the intrinsic layer 114 by wet or dry oxidation in a furnace or reactor, local oxidation over the intrinsic layer 114, or other suitable process step(s). The insulating layer 120 can be formed as a passivating dielectric layer of silicon dioxide, among other suitable dielectric insulators, on the upper surface of the intrinsic layer 14. The insulating layer 120 can be formed to a thickness of between about 2000 Å and about 5000 Å, although other suitable thicknesses can be relied upon.

At step 156, the process includes forming a first opening in the insulating layer 120. Referring back to FIG. 1B, the opening of width $W_3$ can be formed at step 156. The opening of width $W_3$ can be formed in the insulating layer 120 by etching a positive photoresist mask using wet chemistry, the application of plasma, or using another suitable technique. No other openings are formed at step 156.

At step 158, the process includes implanting the P-type region 118 into the top of the intrinsic layer 114. The P-type region 118 can be formed by ion implantation or solid source deposition of a high concentration of P-type dopant through the opening formed in the insulating layer 120 at step 156. The P-type region 118 can be formed by doping the intrinsic layer 114 with Boron, for example, to a concentration of about $2 \times 10^{19}$ atoms/cm$^3$, although other P-type dopants can be used to other charge carrier concentrations to form the junction. When the P-type region 118 is formed, a junction is created between the P-type region 118 and the intrinsic layer 114.

Step 158 can also include thermally driving and diffusing the doping element for the P-type region 118 into the intrinsic layer 114. A rapid, high temperature, thermal processing or annealing process step can be used for thermal driving. The depth of the P-type region 118 and the size of the effective intrinsic region $I_{23}$ can be set by the high temperature thermal drive. In some cases, the thermal driving at step 158 is not relied upon, alone, to diffuse or drive the P-type region 118 to the full extent illustrated in FIG. 1A. In some cases, the thermal driving at steps 162 and 166 can also contribute to the diffusion of the P-type region 118 into the intrinsic layer 114, at least in part, as described below.

Alternatively, to form a NIP diode structure, step 158 can include implanting an N-type region into the top of the intrinsic layer 114. The N-type region can be formed by doping the intrinsic layer 114 with Arsenic, for example, or another suitable N-type dopant, to a suitable concentration. Step 158 can also include thermally driving and diffusing the N-type dopant into the intrinsic layer 114.

At step 160, the process includes forming a second opening in the insulating layer 120. Referring back to FIG. 1B, the opening of width $W_2$ can be formed at step 160. The opening of width $W_2$ can be formed in the insulating layer 120 by etching a positive photoresist mask using wet chemistry, the application of plasma, or using another suitable technique. No other openings are formed at step 160.

In some cases, the width $W_2$ can be the same as the width $W_1$. However, one consideration for the PIN diode structure 100 relates to the extent of lateral diffusion, Ld1, Ld2, and Ld3, that results during the high temperature thermal drives at steps 158, 162, and 166. As the junction depths of the P-type regions 116-118 increase, the lateral diffusions Ld1, Ld2, and Ld3 and the overall size of the resulting anodes also increase. In order to control the capacitance and the high-frequency characteristics of each individual PIN diode, the physical dimensions of the openings formed at steps 156, 160, and 164 can vary as compared to each other, to control the amount of the lateral diffusion. For example, $W_3$ can be formed smaller than $W_2$, and $W_2$ can be formed smaller than $W_1$.

At step 162, the process includes implanting the P-type region 117 into the top of the intrinsic layer 114. The P-type region 117 can be formed by ion implantation or solid source deposition of a high concentration of P-type dopant through the opening formed in the insulating layer 120 at step 160. The P-type region 117 can be formed by doping the intrinsic layer 114 with Boron, for example, to a concentration of about $2 \times 10^{19}$ atoms/cm$^3$, although other P-type dopants can be used to other charge carrier concentrations to form the junction. When the P-type region 117 is formed, a junction is created between the P-type region 117 and the intrinsic layer 114.

Step 162 can also include thermally driving and diffusing the doping element for the P-type region 117 into the intrinsic layer 114. A rapid thermal processing or annealing process step can be used for thermal driving. The depth of the P-type region 117 and the effective intrinsic region 122 can be set by the high temperature thermal drive. In some cases, the thermal driving at step 162 is not relied upon, alone, to diffuse or drive the P-type region 117 to the extent illustrated in FIG. 1A. In some cases, the thermal driving at step 166 can also contribute to the diffusion of the P-type region 117 into the intrinsic layer 114, at least in part, as described below.

Ideally, the thermal driving of the P-type region 117 at step 162 would not impact or change the extent of the diffusion of the P-type region 118 into the intrinsic layer 114.

However, if this thermal restriction cannot be met, then the thermal budget for the thermal drive at step 158 must incorporate or account for the thermal drive at step 162. In other words, the thermal driving at step 162 can also contribute to the diffusion of the P-type region 118 further into the intrinsic layer 114 in some cases, and that diffusion can be accounted for when setting the thermal budget for the thermal drive at step 158.

Alternatively, to form a NIP diode structure, step 162 can include implanting an N-type region into the top of the intrinsic layer 114. The N-type region can be formed by doping the intrinsic layer 114 with Arsenic, for example, to a suitable concentration, although other N-type dopants can be used. Step 162 can also include thermally driving and diffusing the N-type dopant into the intrinsic layer 114.

At step 164, the process includes forming a third opening in the insulating layer 120. Referring back to FIG. 1B, the opening of width $W_3$ can be formed at step 164. The opening of width $W_3$ can be formed in the insulating layer 120 by etching a positive photoresist mask using wet chemistry, the application of plasma, or using another suitable technique. No other openings are formed at step 164.

At step 166, the process includes implanting the P-type region 116 into the top of the intrinsic layer 114. The P-type region 116 can be formed by ion implantation or solid source deposition of a high concentration of P-type dopant through the opening formed in the insulating layer 120 at step 164. The P-type region 116 can be formed by doping the intrinsic layer 114 with Boron, for example, to a concentration of about $2 \times 10^{19}$ atoms/cm$^3$, although other P-type dopants can be used to other charge carrier concentrations to form the junction. When the P-type region 116 is formed, a junction is created between the P-type region 116 and the intrinsic layer 114.

Step 166 can also include thermally driving and diffusing the doping element for the P-type region 116 into the intrinsic layer 114. A rapid thermal processing or annealing process step can be used for thermal driving. The depth of the P-type region 116 and the effective intrinsic region 121 can be set by the high temperature thermal drive. In some cases, the thermal driving at step 166 can also contribute to the diffusion of the P-type regions 117 and 118 into the intrinsic layer 114, at least in part. Ideally, the thermal driving of the P-type region 116 at step 166 would not impact or change the extent of the diffusion of the P-type regions 117 and 118 into the intrinsic layer 114. However, if this thermal restriction cannot be met, then the thermal budgets for the thermal drive at steps 158 and 162 must incorporate or account for the thermal drive at step 166.

Alternatively, to form a NIP diode structure, step 166 can include implanting an N-type region into the top of the intrinsic layer 114. The N-type region can be formed by doping the intrinsic layer 114 with Arsenic, for example, to a suitable concentration, although other N-type dopants can be used. Step 166 can also include thermally driving and diffusing the N-type dopant into the intrinsic layer 114.

The process shown in FIG. 1B can also include process steps to form more windows and implant additional anodes in the PIN diode structure 10. Additional process steps, including backside processing steps, can also be relied upon to form the cathode contact 130 and the anode contacts 132, 134, and 136. Other steps can be relied upon to form components on the PIN diode structure 100, as part of a larger integrated circuit device including diodes, capacitors, inductors, resistors, and layers of metal to electrically interconnect the components together to form switches, limiters, and other devices. Particularly, additional steps can be relied upon to form capacitors, inductors, resistors, and layers of metal to electrically interconnect the components together to form the monolithic, multi-throw switches described below with reference to FIGS. 6-10.

FIGS. 1A and 1B encompass monolithic, vertical, planar semiconductor structures including a number of diodes having different intrinsic regions. The diodes have intrinsic regions of different thicknesses as compared to each other. The diodes can also be integrated with other components, such as capacitors, resistors, and inductors on the monolithic semiconductor structure in a monolithic circuit format. The monolithic format can provide a number of advantages over conventional techniques where discrete diodes are used, such as smaller size, reduced cost, and better and more controllable frequency response.

The concepts shown in FIGS. 1A and 1B can be extended to other types and arrangements of diode devices. For example, the cathodes of the diodes are electrically connected together in FIG. 1A, although the diodes (and the cathodes of the diodes) can be separated from each other in other example embodiments described below. Additionally, topside contacts can be formed for both the anodes and the cathodes of the diodes, and the backside contacts can be isolated for each diode, or even omitted in some cases, as described below. The diodes can also be integrated with other components, such as capacitors, resistors, and inductors on the monolithic semiconductor structure in a monolithic circuit format. The monolithic format can provide a number of advantages over conventional techniques where discrete diodes are used, such as smaller size, reduced cost, and better and more controllable frequency response. According to aspects of the embodiments described below, when these diode devices of different intrinsic regions are used in the design of a monolithic, multi-throw switch, the switch exhibits improved reliability, ruggedness, RF performance, size, and cost as compared to the current discrete solutions.

Figure 2:
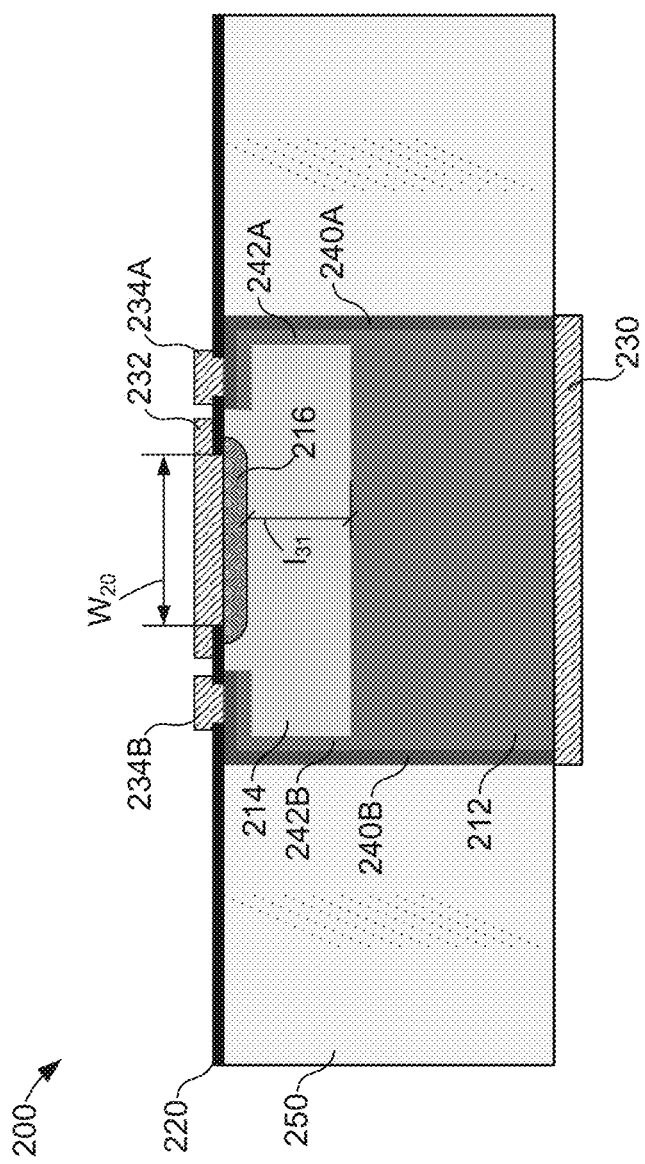
FIG. 2 illustrates an example HMIC silicon PIN diode structure according to various embodiments described herein.

Turning to other embodiments, FIG. 2 illustrates an example HMIC silicon PIN diode structure 200 according to various embodiments described herein. As compared to the diode structure 100 shown in FIG. 1A, the diode structure 200 includes a highly insulative material, such as glass, to form a type of heterolithic microwave integrated circuit (HMIC). The PIN diode structure 200 is illustrated as a representative example in FIG. 2. The shapes and sizes of the layers of the PIN diode structure 200 are not necessarily drawn to scale. The layers shown in FIG. 2 are not exhaustive, and the PIN diode structure 200 can include other layers and elements not separately illustrated. Additionally, the PIN diode structure 200 can be formed as part of a larger integrated circuit device in combination with other diodes, capacitors, inductors, resistors, and layers of metal to electrically interconnect the circuit elements together to form switches, limiters, and other devices. In other embodiments, one or more NIP diodes can also be formed to have a structure similar to the structure shown in FIG. 2, by interchanging the P-type and N-type dopants.

The PIN diode structure 200 includes an N-type semiconductor substrate 212, an intrinsic layer 214, and a P-type region 216 formed in the intrinsic layer 214. These layers can be similar in form and size as compared to the corresponding layers in the structure 100, as shown in FIG. 1A. The N-type semiconductor substrate 212 forms a cathode and the P-type region 216 forms an anode of the PIN diode structure 200. The P-type region 216 is formed through the opening of width $W_{20}$ in the insulating layer 220. The P-type region 216 can be formed to a depth of between about 2-5

μm in the intrinsic layer 214. With a 100 μm thick intrinsic layer 214, for example, the size of the effective intrinsic region 131 can range between about 8-95 μm.

The PIN diode structure 200 includes a topside anode contact 232 formed over the P-type region 216. The PIN diode structure 200 also includes a backside cathode contact 230 and topside cathode contacts 234A and 234B. Metallic sidewall conductors 240A and 240B extend from and electrically connect the backside cathode contact 230 to the topside cathode contacts 234A and 234B, and N+-type doped sidewalls 242A and 242B insulate the metallic sidewall conductors 240A and 240B from the intrinsic layer 214.

As shown in FIG. 2, the N+-type doped sidewalls 242A and 242B and the metallic sidewall conductors 240A and 240B are formed along sidewalls of the intrinsic layer 214 and the substrate 212. The sidewalls of the intrinsic layer 214 and the substrate 212 are exposed through vertical etching of the intrinsic layer 214 and the substrate 212, which forms the intrinsic layer 214 and the substrate 212 into a type of pedestal as shown. The etching process step can be performed, in one example, after the P-type region 216 is formed but before the topside anode contact 232 and cathode contacts 234A and 234B are formed. Either a wet chemical etching or a dry etching technique can be relied upon to expose the sidewalls, as deep cavities can be obtained with either technique.

With a substrate 212 of sufficient thickness, the etching process can etch down through the intrinsic layer 214 and into the substrate 212 to a total depth of about 150-160 μm from a topside of the PIN diode structure 200. If wet chemical etching is relied upon, the sidewalls of the intrinsic layer 214 and the substrate 212 can extend down at an angle (e.g., at about 54.7 degrees) from the top surface of the PIN diode structure 200. If dry etching is relied upon, the sidewalls of the intrinsic layer 214 and the substrate 212 can extend substantially straight down (e.g., at an angle of about 90 degrees down from the top surface of the PIN diode structure 200).

The N+-type doped sidewalls 242A and 242B and the metallic sidewall conductors 240A and 240B can be formed after the etching. The N+-type doped sidewalls 242A and 242B can be formed by diffusing phosphorus, for example, or another N+-type dopant, into the exposed sidewalls of the intrinsic layer 214 and the substrate 212. The metallic sidewall conductors 240A and 240B can then be formed by depositing metal, such as cobalt silicide ($CoSi_2$), over the N+-type doped sidewalls 242A and 242B.

The insulator 250 can then be formed around the metallic sidewall conductors 240A and 240B and, if multiple diodes are formed, between the diodes. The application of the insulator 250 can start with a blanket deposition of about 1500 Å of silicon nitride, for example, by low pressure chemical vapor deposition (LPCVD), followed by the deposit of about 4000 Å of low temperature oxide (LTO). Those layers (although not shown in FIG. 2) can encapsulate and protect the diodes during the application of the insulator 250. The insulator 250 can then be fused into the area around the metallic sidewall conductors 240A and 240B, forming a conformal layer. The insulator 250 can be formed to a thickness of at least 50 μm higher than the depth of the vertical etch, to allow for a step of glass planarization.

The insulator 250 can be a borosilicate glass, for example, which exhibits a low dielectric constant, a low loss tangent, and a thermal coefficient of expansion similar to silicon for ruggedness over a broad temperature range, although other types of insulators can be relied upon. Although a single diode device is illustrated in FIG. 2, the insulator 250 can be relied upon to separate a number of different, side-by-side diode devices as described below with reference to FIGS. 4A, 4B, and 5. The insulator 250 also permits a variety of different electrical connections among the diodes, by isolating them from each other.

After the insulator 250 is fused, a number of backside processing steps can be performed. A backside of the substrate 212 can be ground down until the insulator 250 is exposed. The backside cathode contact 230 can then be formed to extend over the metallic sidewall conductors 240A and 240B and the bottom side of the substrate 212. When formed, the backside cathode contact 230 is electrically connected to the metallic sidewall conductors 240A and 240B. The backside cathode contact 230 is then electrically connected to the topside cathode contacts 234A and 234B via the metallic sidewall conductors 240A and 240B. Thus, with the inclusion of the metallic sidewall conductors 240A and 240B and the topside cathode contacts 234A and 234B, both anode and cathode contacts are available on top of the PIN diode structure 200. As such, the PIN diode structure 200 is designed to facilitate shunt connections among diodes.

Figure 3:
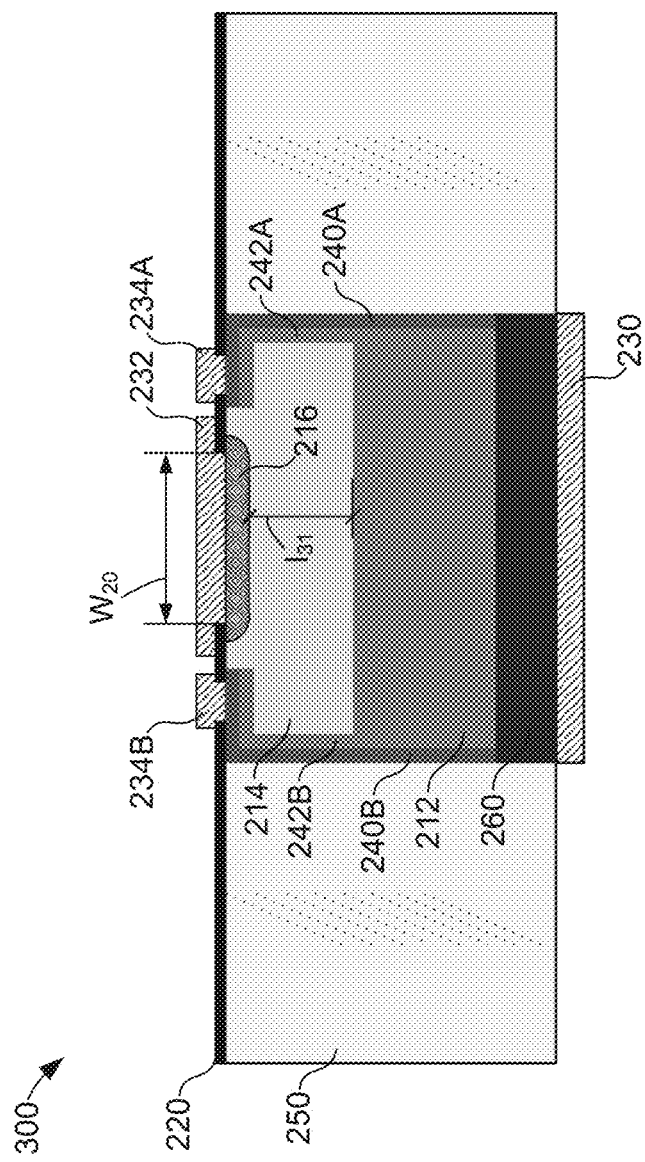
FIG. 3 illustrates another example HMIC silicon PIN diode structure according to various embodiments described herein.

In another embodiment, FIG. 3 illustrates an example HMIC silicon PIN diode structure 300. As compared to the PIN diode structure 300 shown in FIG. 2, the PIN diode structure 300 also includes an insulating material layer 260, such as boron nitride or a thermal epoxy, among other suitable insulators, between the N-type semiconductor substrate 212 and the backside cathode contact 230. The semiconductor substrate 212 can be etched from the backside of the semiconductor substrate 212 to a depth of about 50 μm, opening an area or void for the insulating material layer 260. Thus, the diode structure 300 is particularly suitable for series connections among diodes. The cathode contact 230 may be optionally included in the embodiment shown in FIG. 3 for the purpose of mechanical die attachment. In some cases, the cathode contact 230 can be omitted.

Both the PIN diode structure 200 shown in FIG. 2 and the PIN structure 300 shown in FIG. 3 can be extended to NIP structures. Additionally, both the PIN diode structure 200 and the PIN structure 300 can be extended to include a number of diodes with different "I" region thicknesses, in a monolithic format, as described below.

Figure 4A:
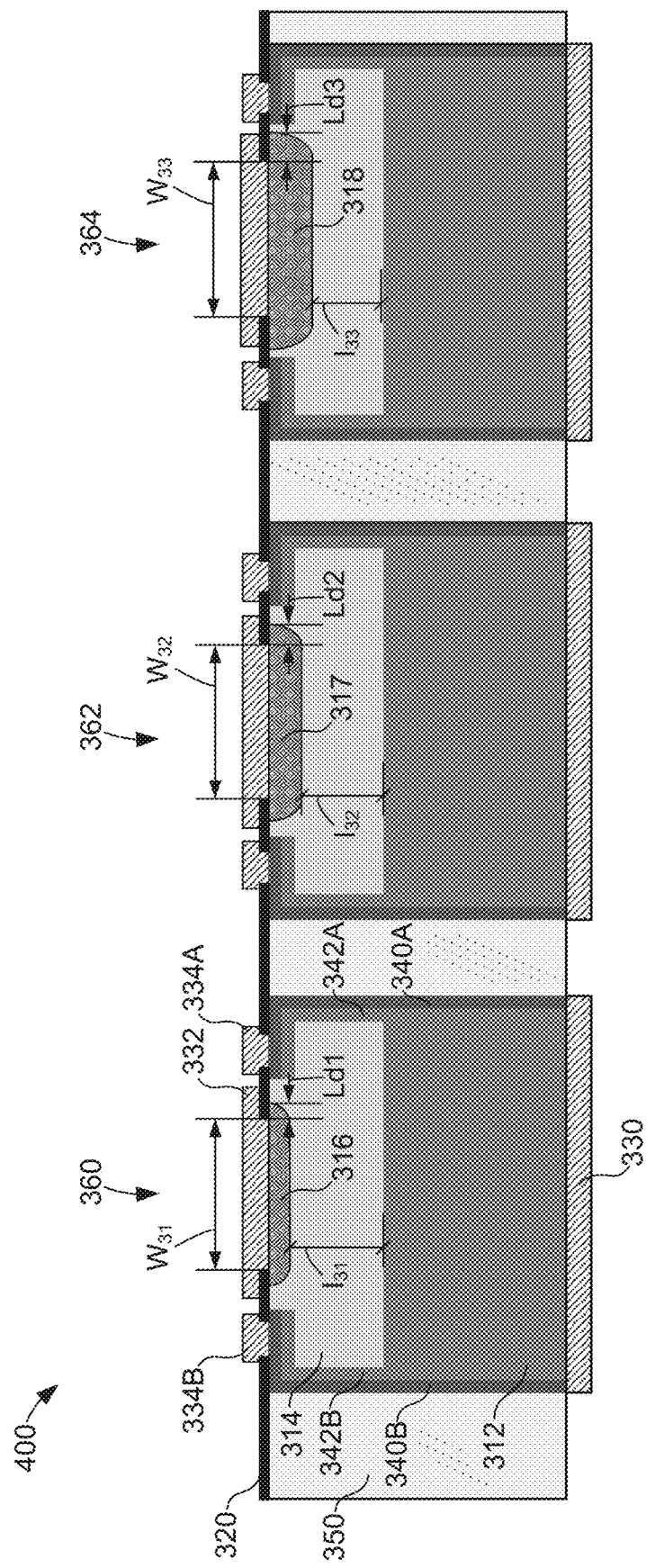
FIG. 4A illustrates another example HMIC silicon PIN diode structure with multi-thickness intrinsic regions according to various embodiments described herein.

FIG. 4A illustrates an example HMIC silicon PIN diode structure 400 according to various embodiments described herein. The PIN diode structure 400 is illustrated as a representative example in FIG. 4A. The shapes and sizes of the layers of the PIN diode structure 400 are not necessarily drawn to scale. The layers shown in FIG. 4A are not exhaustive, and the PIN diode structure 400 can include other layers and elements not separately illustrated. Additionally, the PIN diode structure 400 can be formed as part of a larger integrated circuit device in combination with other diodes, capacitors, inductors, resistors, and layers of metal to electrically interconnect the circuit elements together to form switches, limiters, and other devices. In other embodiments, one or more NIP diodes can also be formed to have a structure similar to the structure shown in FIG. 4A, by interchanging the P-type and N-type dopants.

The PIN diode structure 400 includes PIN diode devices 360, 362, and 364, formed as first, second, and third pedestals. The PIN diode device 360 includes an N-type semiconductor substrate 312 and an intrinsic layer 314, which are formed into a first pedestal by etching as described below. These layers are similar in vertical thickness as compared to the corresponding layers in the structure 200 shown in FIG. 2. A P-type region 316 is formed in the intrinsic layer 314.

The N-type semiconductor substrate 312 forms a cathode and the P-type region 316 forms an anode of the PIN diode device 360. The P-type region 316 is formed through the opening of width $W_{31}$ in the insulating layer 320. The PIN diode devices 362 and 364 also include similar N-type semiconductor substrate and an intrinsic layers as shown, which are formed into first and second pedestals, respectively, by etching.

The PIN diode devices 362 and 364 are similar in form and size as compared to the PIN diode device 360. However, the P-type region 317 is diffused deeper than the P-type region 316, and the P-type region 318 is diffused deeper than the P-type region 317. To obtain that form, a method of manufacturing the PIN diode structure 400 can follow the process steps illustrated in FIG. 1B and described above. Particularly, the P-type regions 316-318 can be formed sequentially, or in turn, in the intrinsic layer 314 according to the process steps shown in FIG. 1B. In that way, the P-type region 316 is diffused to the least extent into the intrinsic layer 314, the P-type region 317 diffused to a greater extent into the intrinsic layer 314, and the P-type region 318 is diffused the greatest extent into the intrinsic layer 314. Thus, the effective intrinsic region $I_{31}$ under the P-type region 316 is larger than the effective intrinsic region $I_{32}$ under the P-type region 317, and the effective intrinsic region $I_{32}$ is larger than the effective intrinsic region $I_{33}$ under the P-type region 318. In one example, the effective intrinsic region $I_{31}$ can be between about 20-23 μm, the effective intrinsic region $I_{32}$ can be about 12 μm, and the effective intrinsic region $I_{33}$ can be about 5 μm, although other ranges are within the scope of the embodiments.

The extent of the lateral diffusions, Ld1, Ld2, and Ld3 of the P-type regions 316-318 can also vary as described above, with the lateral diffusion Ld1 being the smallest and the lateral diffusion Ld3 being the largest. In some cases, to control the capacitance and the high-frequency characteristics of the PIN diode devices 360, 362, and 364, individually, the widths $W_{31}$-$W_{33}$ of the openings formed in the insulating layer 320 can vary as compared to each other. For example, $W_{33}$ can be smaller than $W_{32}$, and $W_{32}$ can be smaller than $W_{31}$.

The PIN diode device 360 includes a topside anode contact 332 formed over the P-type region 316. The PIN diode device 360 also includes a backside cathode contact 330 and topside cathode contacts 334A and 334B. Metallic sidewall conductors 340A and 340B extend from and electrically connect the backside cathode contact 330 to the topside cathode contacts 334A and 334B, and N+-type doped sidewalls 342A and 342B insulate the metallic sidewall conductors 340A and 340B from the intrinsic layer 314. These features can be similar in form and size as compared to the corresponding features in the structure 200 shown in FIG. 2. The PIN diode devices 362 and 364 can include similar features as shown in FIG. 5A.

The N+-type doped sidewalls 342A and 342B and the metallic sidewall conductors 340A and 340B are formed along sidewalls of the intrinsic layer 314 and the substrate 312 of the PIN diode device 360. The sidewalls of the intrinsic layer 314 and the substrate 312 are exposed through vertical etching of the intrinsic layer 314 and the substrate 312 in a manner similar to that described above with reference to FIG. 2, but among all of the PIN diode devices 360, 362, and 364. The insulator 350 can then be formed around the metallic sidewall conductors 340A and 340B and the corresponding sidewall features of the PIN diode devices 362 and 364.

The application of the insulator 350 can start with a blanket deposition of silicon nitride by LPCVD, for example, followed by a deposit of LTO. Those layers (although not shown in FIG. 5A) can encapsulate and protect the PIN diode devices 360, 362, and 364 during the application of the insulator 350. The insulator 350 can then be fused into the etched areas around the PIN diode devices 360, 362, and 364, forming a conformal layer. The insulator 350 can be formed to a thickness of at least 50 μm higher than the depth of the vertical etch, to allow for a step of glass planarization. The insulator 350 can be a borosilicate glass, for example, which exhibits a low dielectric constant, a low loss tangent, and a thermal coefficient of expansion similar to silicon for ruggedness over a broad temperature range, although other types of insulators can be relied upon.

After the insulator 350 is fused, a number of backside processing steps can be performed. A backside of the substrate 312 can be ground down until the insulator 350 is exposed. The backside cathode contact 330 can then be formed to extend over the metallic sidewall conductors 340A and 340B and the bottom side of the substrate 312. When formed, the backside cathode contact 330 is electrically connected to the metallic sidewall conductors 340A and 340B. The backside cathode contact 330 is then electrically connected to the topside cathode contacts 334A and 334B via the metallic sidewall conductors 340A and 340B. The PIN diode structure 400 is designed to facilitate shunt connections among the PIN diode devices 360, 362, and 364.

Figure 4B:
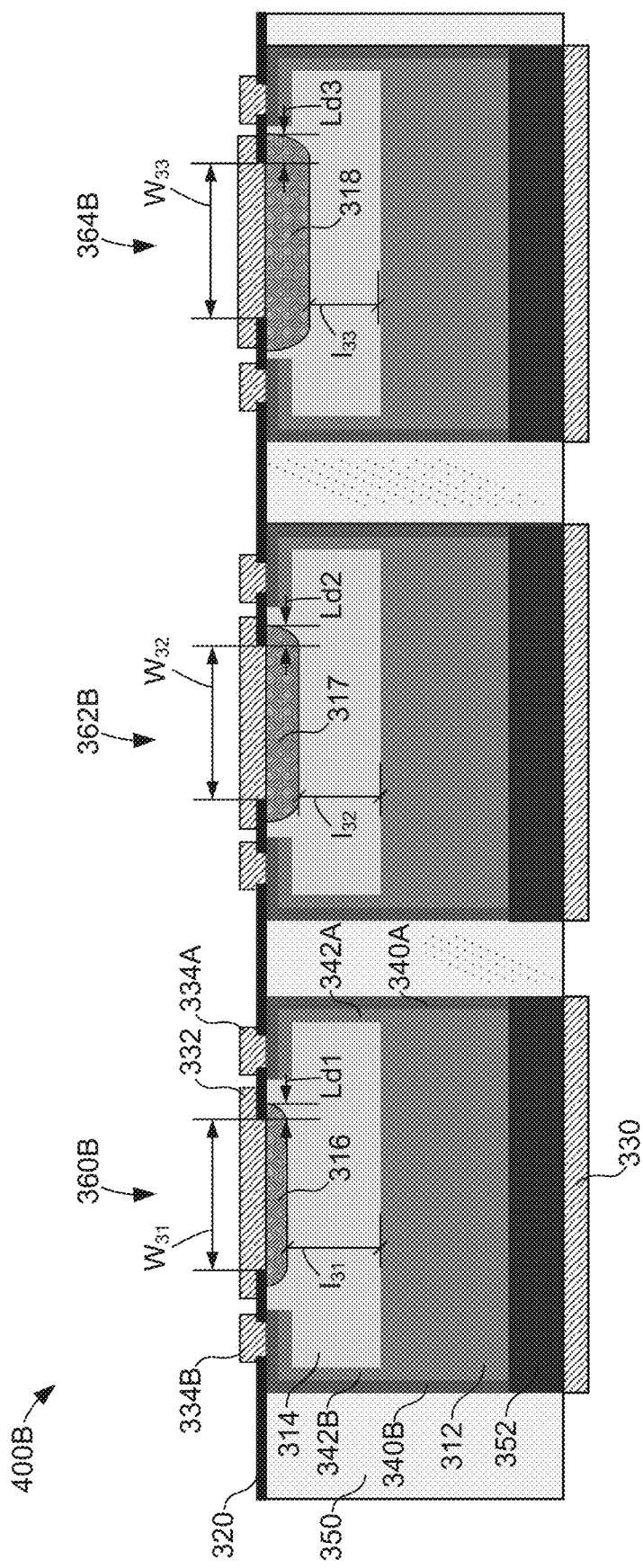
FIG. 4B illustrates another example HMIC silicon PIN diode structure with multi-thickness intrinsic regions according to various embodiments described herein.

FIG. 4B illustrates another example HMIC silicon PIN diode structure 400B according to various embodiments described herein. The PIN diode structure 400B includes PIN diode devices 360B, 362B, and 364B. The PIN diode structure 400B is similar to the PIN diode structure 400 shown in FIG. 5A. However, as compared to the PIN diode device 360 shown in FIG. 4A, the PIN diode device 360B in FIG. 4B also includes the insulating material layer 352, which is similar to the insulating material layer 260 in FIG. 3. The PIN diode device 362B and 364B also include similar insulating material layers. Thus, the PIN diode structure 400B is formed for series connections among the PIN diode devices 360B, 362B, and 364B. The cathode contacts, such as the cathode contact 330, may be optionally included in the embodiment shown in FIG. 4B for the purpose of mechanical die attachment. In some cases, the cathode contacts can be omitted.

In other examples, a diode structure including a combination of the PIN diode devices 360, 362, and 364, as shown in FIG. 4A, and the PIN diode devices 360B, 362B, and 364B, as shown in FIG. 4B, can be formed together on the same substrate. In that case, a number of PIN diodes can be arranged in both series and shunt configurations along with various components in a monolithic circuit format suitable for microwave circuit applications.

Figure 5:
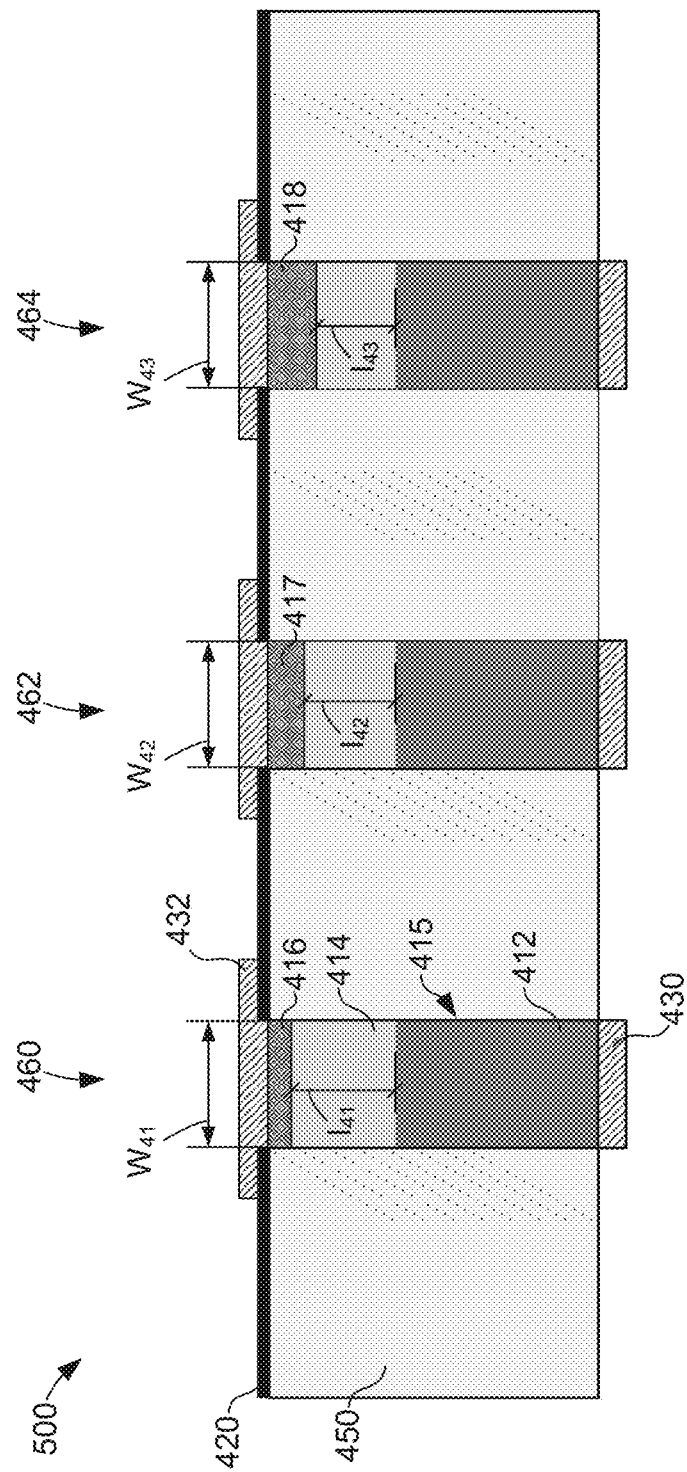
FIG. 5 illustrates another example HMIC silicon PIN diode structure with multi-thickness intrinsic regions according to various embodiments described herein.

FIG. 5 illustrates an example HMIC silicon PIN diode structure 500 according to various embodiments described herein. The PIN diode structure 500 is illustrated as a representative example in FIG. 5. The shapes and sizes of the layers of the PIN diode structure 500 are not necessarily drawn to scale. The layers shown in FIG. 5 are not exhaustive, and the PIN diode structure 500 can include other layers and elements not separately illustrated. Additionally, the PIN diode structure 500 can be formed as part of a larger integrated circuit device in combination with other diodes, capacitors, inductors, resistors, and layers of metal to electrically interconnect the circuit elements together to form switches, limiters, and other devices. In other embodiments, one or more NIP diodes can also be formed to have a structure similar to the structure shown in FIG. 5, by interchanging the P-type and N-type dopants.

The PIN diode structure 500 includes PIN diode devices 460, 462, and 464. The PIN diode device 460 includes an N-type semiconductor substrate 412, an intrinsic layer 414, and a P-type region 416 formed in the intrinsic layer 414. The N-type semiconductor substrate 412 forms a cathode and the P-type region 416 forms an anode of the PIN diode device 460. The P-type region 416 is formed through the opening of width $W_{41}$ in the insulating layer 420. The PIN diode device 460 includes a topside anode contact 432 formed over the P-type region 416. The PIN diode device 460 also includes a backside cathode contact 430.

The PIN diode devices 462 and 464 are similar in form and size as compared to the PIN diode device 460. However, the P-type region 417 is diffused deeper than the P-type region 416, and the P-type region 418 is diffused deeper than the P-type region 417. To obtain that form, a method of manufacturing the PIN diode structure 500 can follow the process steps illustrated in FIG. 1B and described above. Particularly, the P-type regions 416-418 can be formed sequentially, or in turn, in the intrinsic layer 414 according to the process steps shown in FIG. 1B. In that way, the P-type anode region 416 is diffused to the least extent into the intrinsic layer 414, the P-type region 417 diffused to a greater extent into the intrinsic layer 414, and the P-type region 418 is diffused the greatest extent into the intrinsic layer 414. Thus, the effective intrinsic region $I_{41}$ under the P-type region 416 is larger than the effective intrinsic region 142 under the P-type region 417, and the effective intrinsic region 142 is larger than the effective intrinsic region 143 under the P-type region 418. In one example, the effective intrinsic region $I_{41}$ can be between about 20-23 μm, the effective intrinsic region $I_{42}$ can be about 12 μm, and the effective intrinsic region $I_{43}$ can be about 5 μm, although other ranges are within the scope of the embodiments.

Sidewall insulators 415 can also be formed along the sidewalls of the intrinsic layer 414 and the substrate 412 of the PIN diode device 460. The sidewall insulators 415 can include a passivating dielectric or oxide layer. To form the sidewall insulators 415, the sidewalls of the intrinsic layer 414 and the substrate 412 are exposed through vertical etching in a manner similar to that described above with reference to FIG. 2, but among all of the PIN diode devices 460, 462, and 464. The sidewall insulators 415 can then be formed on the sidewalls of the PIN diode device 460 and the corresponding sidewalls of the PIN diode devices 462 and 464, to ensure there are no vertical leakage paths between the anodes and the cathodes in those devices.

The insulator 450 can then be fused among the PIN diode devices 460, 462, and 464 in a manner similar to that described above. The application of the insulator 450 can start with a blanket deposition of silicon nitride by LPCVD, for example, followed by a deposit of LTO. Those layers (although not shown in FIG. 5) can encapsulate and protect the PIN diode devices 460, 462, and 464 during the application of the insulator 450. The insulator 450 can then be fused into the etched areas around the PIN diode devices 460, 462, and 464, forming a conformal layer. The insulator 450 can be formed to a thickness of at least 50 μm higher than the depth of the vertical etch, to allow for a step of glass planarization. The insulator 450 can be a borosilicate glass, for example, which exhibits a low dielectric constant, a low loss tangent, and a thermal coefficient of expansion similar to silicon for ruggedness over a broad temperature range, although other types of insulators can be relied upon.

After the insulator 450 is fused, a number of backside processing steps can be performed. A backside of the substrate 412 can be ground down until the insulator 450 is exposed. The backside cathode contact 430 can then be formed to extend over the bottom side of the substrate 412. In some cases, rather than forming a separate backside cathode contact for each of the PIN diode devices 460, 462, and 464 as shown in FIG. 5, a single backside cathode contact can be formed to extend across the N-type semiconductor substrates of all the PIN diode devices 460, 462, and 464. The PIN diode structure 500 is designed to facilitate shunt connections among the PIN diode devices 460, 462, and 464.

Because no topside cathode returns are needed for shunt configurations of PIN diodes, the approach shown in FIG. 5 can be relied upon to control the capacitance of the individual PIN diode devices 460, 462, and 464. In FIG. 5, the etching process is used to determine the physical dimensions of the P-type regions 416, 417, and 418, independent of the junction depths of the anodes and the sizes of the windows $W_{41}$-$W_{43}$ in the insulating layer 420. Thus, the concerns regarding the extent of the lateral diffusions, Ld1, Ld2, and Ld3 in the other embodiments can be controlled according to the approach shown in FIG. 5. In other words, the etching process is used to determine the physical dimensions of the P-type regions 416, 417, and 418, to control the capacitance and the high-frequency characteristics of each individual PIN diode.

The diode structures and methods described above can be used to fabricate a wide variety of useful integrated circuits. For example, the diodes described above can be integrated with various components in a monolithic circuit format suitable for microwave circuit applications. The diodes can be integrated with capacitors, resistors, and inductors formed on the monolithic semiconductor structure. The monolithic format can provide a number of advantages over conventional techniques where discrete diodes are used, such as smaller size, reduced cost, and better and more controllable frequency response. According to aspects of the embodiments described below, when diodes of different intrinsic regions are used in the design of a monolithic multi-throw switch, the switch exhibits improved reliability, ruggedness, RF performance, size, and cost as compared to the current discrete solutions.

Figure 6:
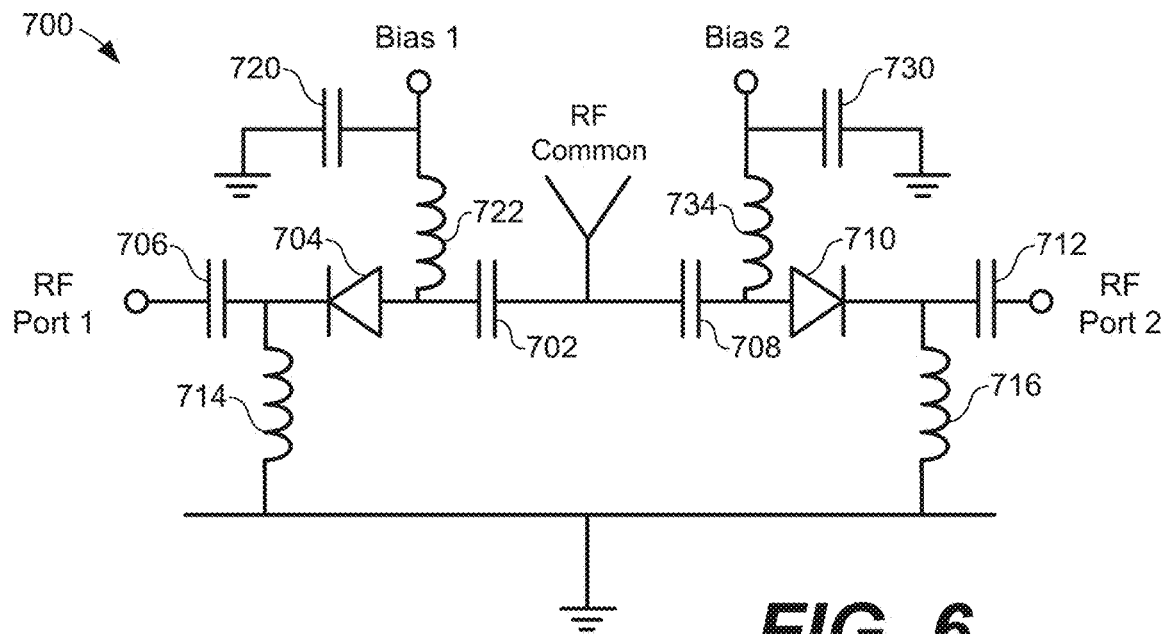
FIG. 6 illustrates an example series-connected single pole double through (SPDT) switch according to various embodiments described herein.

FIG. 6 illustrates an example series-connected SPDT switch 700 according to various embodiments described herein. The switch 700 is illustrated as a representative example for discussion of the advantages of using a monolithic structure of diodes having different intrinsic regions in the design of a monolithic switch. Other arrangements of series-connected PIN diode switches with additional ports (e.g., series-connected SP3T, SP4T, etc. switches) are within the scope of the embodiments.

As shown in FIG. 6, the switch 700 includes an RF common port, a first RF port, a second RF port, a first bias input node, and a second bias input node. In operation, the switch 700 can either "pass" or "stop" RF signals between the RF common and the first RF port and the second RF port. Particularly, the switch 700 can either pass or stop an RF signal between the RF common and the first RF port based on a voltage bias applied at the first bias input. The switch 700 can also pass or stop an RF signal between the RF common and the second RF port based on a voltage bias applied at the second bias input.

The switch 700 includes a capacitor 702, a PIN diode 704, and a capacitor 706 electrically coupled or connected in series between the RF common and the first RF port. Thus, the PIN diode 704 is electrically coupled to a node between the RF common and the first RF port. The switch 700 also includes a capacitor 708, a PIN diode 710, and a capacitor 712 connected in series between the RF common and the second RF port. Thus, the PIN diode 710 is electrically coupled to a node between the RF common port and the second RF port. The switch 700 includes an RF choke 714 or inductor that is connected at a node between the capacitor 706 and the PIN diode 704 at one and connected to ground at another end. The switch 700 also includes an RF choke 716 or inductor that is connected at a node between the capacitor 712 and the PIN diode 710 at one and connected to ground at another end. The switch 700 also includes a first bias network, including a capacitor 720 connected from the first bias input to ground and an RF choke 722 connected from the first bias input to an anode of the PIN diode 704. The switch 700 also includes a second bias network, including a capacitor 730 connected from the second bias input to ground and an RF choke 734 connected from the second bias input to an anode of the PIN diode 710.

In the switch 700, each of the PIN diodes 704 and 710 can be placed into a "pass" condition when it is forward biased. The PIN diode 704 can be forward biased by application of a sufficient voltage at the first bias input. The PIN diode 710 can be forward biased by application of a sufficient voltage at the second bias input. When forward biased, each of the PIN diodes 704 and 710 presents a respective low forward resistance, $R_S$, between the RF common and one of the RF ports. For the "stop" condition, the PIN diodes 704 and 710 can be zero or reverse biased. When reverse biased, each of the PIN diodes 704 and 710 presents a high impedance between the RF input and the RF ports.

In series-connected switches, such as the switch 700, insertion loss and power dissipation are functions of the forward series on-resistance, $R_S$, of the PIN diodes 704 and 710. The maximum isolation obtainable is primarily a function of the capacitance, $X_C$, of the respective PIN diodes 704 and 710. In a series-connected SPST switch, the insertion loss, IL, and the isolation, ISO, are given (in dB) by:

$$IL = 20 \cdot \log_{10}\left[1 + \left(\frac{R_S}{2 \cdot Z_0}\right)\right] \quad (1)$$

$$ISO = 10 \cdot \log_{10}\left[1 + \left(\frac{X_C}{2 \cdot Z_0}\right)^2\right] \quad (2)$$

For multi-throw series-connected switches, the insertion loss is slightly higher due to mismatch caused by the capacitance of any PIN diodes in "stop" arms. Also, for multi-throw switches, 6 dB can be added to the isolation figure to account for the 50 percent voltage reduction across the "stop" arm due to the characteristic impedance of the termination.

Among other operating characteristics, the forward resistances and capacitances of the respective PIN diodes 704 and 710 are functions of the structural characteristics of the diodes, including the "I" region thicknesses. Using the techniques and structures described herein, the switch 700 can be realized monolithically, in a single package, using a combination of one or more PIN diodes with different "I" region thicknesses. The PIN diodes 704 and 710 can be embodied using a combination of the PIN diodes of the structures shown in FIG. 1A, 4A, 4B, or 5, for example, with PIN diodes of different "I" region thicknesses. For example, if the switch 700 is functioning in a dedicated transmit/receive mode, the transmit PIN diode 704 can have a thicker "I" region than the receive PIN diode 710 to maximize power handling for the transmit arm and maximize receive sensitivity/insertion loss in the receive arm.

While FIG. 6 illustrates an SPDT configuration of the series-connected switch 700, the concepts described herein can be extended to have more ports (e.g., up to SP8T or more) and more inputs (e.g., DPDT, etc.). The configurations are also not restricted to one series-connected diode per arm. A SPDT switch can include two, three, or more series-connected PIN diodes in each arm, and each of the series-connected PIN diodes in any given arm can have the same or different "I" region thicknesses. These configurations can also be realized monolithically, in a single package. Using the concepts described herein, a monolithic, multi-throw series-connected switch with a combination of PIN diodes having different "I" region thicknesses can be formed.

A process of fabricating the switch 700 can include one or more of the steps described above with reference to FIG. 1B to form the PIN diodes 704 and 710. Additional process steps can be relied upon to form the capacitors, inductors, transmission lines, bias networks, and other elements shown in FIG. 6. The additional circuit elements can be formed over the intrinsic layer of the PIN diodes 704 and 710. Additional process steps can also be relied upon to form the metal layers and realize the electrical connections between the circuit elements shown in FIG. 6. For example, the steps can include forming at least one metal layer over the intrinsic layer of the PIN diodes 704 and 710 to electrically couple the first PIN diode to a node between the common RF port and the first port of the switch 700 and to electrically couple the second PIN diode to a node between the RF common port and the second port of the switch 700.

Figure 7:
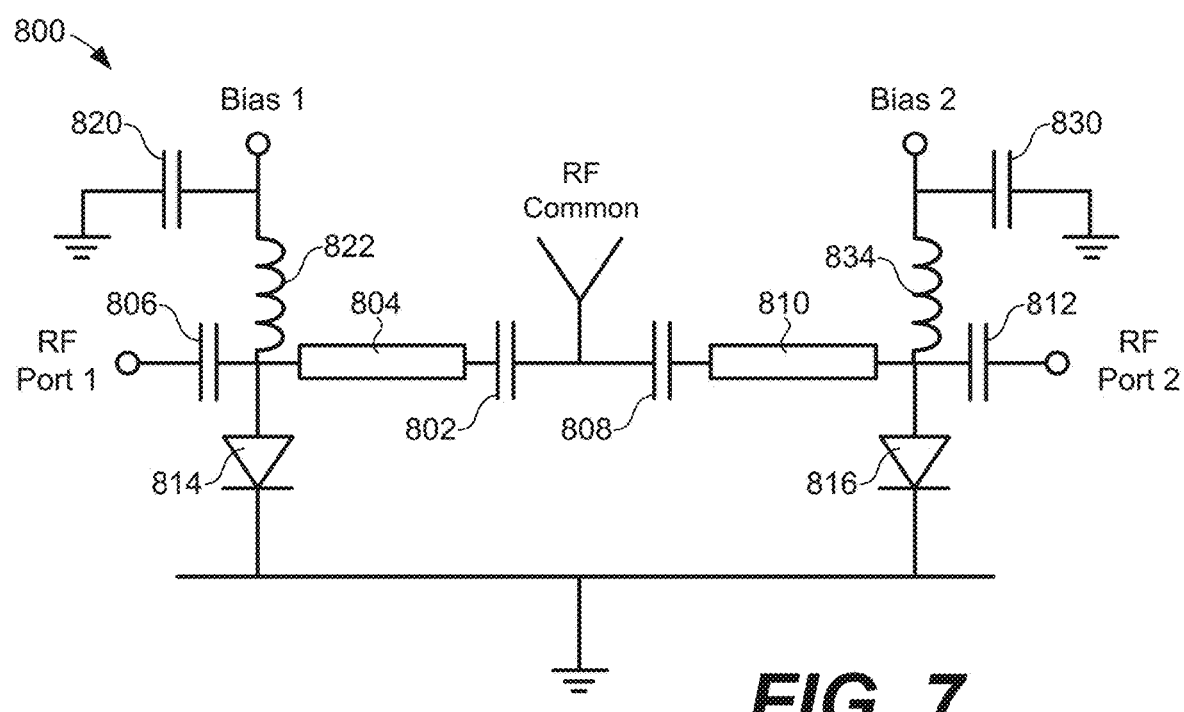
FIG. 7 illustrates an example shunt-connected SPDT switch according to various embodiments described herein.

FIG. 7 illustrates an example shunt-connected SPDT switch 800 according to various embodiments described herein. The switch 800 is illustrated as a representative example for discussion of the advantages of using a monolithic structure of diodes having different intrinsic regions in the design of a monolithic switch. Other arrangements of shunt-connected PIN diode switches with additional ports are within the scope of the embodiments.

As shown in FIG. 7, the switch 800 includes an RF common, a first RF port, a second RF port, a first bias input, and a second bias input. In operation, the switch 800 can either "pass" or "stop" RF signals between the RF common and the first RF port and the second RF port. Particularly, the switch 800 can either pass or stop an RF signal between the RF common and the first RF port based on a voltage bias applied at the first bias input. The switch 800 can also pass or stop an RF signal between the RF common and the second RF port based on a voltage bias applied at the second bias input.

The switch 800 includes a capacitor 802, a transmission line 804, and a capacitor 806 electrically coupled or connected in series between the RF common and the first RF port. The transmission line 804 can be a quarter-wavelength (i.e., λ/4) transmission line in one example, and the capacitors 802 and 804 can be electrically coupled at any suitable position along the transmission line 804. The switch 800 also includes a capacitor 808, a transmission line 810, and a capacitor 812 electrically coupled or connected in series between the RF common and the second RF port. The transmission line 810 can be a quarter-wavelength (i.e., λ/4) transmission line in one example, and the capacitors 808 and 812 can be electrically coupled at any suitable position along the transmission line 810.

The switch 800 also includes a PIN diode 814 with an anode connected between the capacitor 806 and the capacitor 802 and a cathode connected to ground. Thus, the PIN diode 814 is electrically coupled to a node between the RF common port and the first RF port. The switch 800 also includes a PIN diode 816 with an anode connected between the capacitor 808 and the capacitor 812 and a cathode connected to ground. Thus, the PIN diode 816 is electrically coupled to a node between the RF common port and the second RF port. The switch 800 also includes a first bias network, including a capacitor 820 connected from the first bias input to ground and an RF choke 822 connected from the first bias input to an anode of the PIN diode 814. The switch 800 also includes a second bias network, including a capacitor 830 connected from the second bias input to ground and an RF choke 834 connected from the second bias input to an anode of the PIN diode 816.

In the switch 800, each of the PIN diodes 814 and 816 can be placed into a "pass" condition when it is forward biased. For the "stop" condition, the PIN diode 814 can be forward biased by application of a sufficient voltage at the first bias input. The PIN diode 816 can be forward biased by application of a sufficient voltage at the second bias input. When forward biased, each of the PIN diodes 814 and 816 presents a respective low forward resistance, $R_S$, to ground. For the "pass" condition, the PIN diodes 814 and 816 can be zero or reverse biased. When reverse biased, each of the PIN diodes 814 and 710 presents a high impedance to ground.

Shunt-connected switches offer high isolation for many applications. Because the PIN diodes 814 and 816 can be coupled to a heat sink at one electrode, the switch 800 can handle relatively more RF power than the switch 800 in many cases. In shunt-connected switch designs, such as the switch 800, isolation and power dissipation are functions of the forward resistance, $R_S$, of the PIN diodes 814 and 816. The insertion loss is primarily dependent on the capacitance, $X_C$, of the respective PIN diodes 814 and 816. In a shunt-connected SPST switch, the insertion loss, IL, and the isolation, ISO, are given (in dB) by:

$$IL = 10 \cdot \log_{10}\left[1 + \left(\frac{Z_0}{2 \cdot X_C}\right)^2\right] \quad (3)$$

$$ISO = 20 \cdot \log_{10}\left[1 + \left(\frac{Z_0}{2 \cdot R_S}\right)\right]$$

$$IL = 10 \cdot \log_{10}\left[1 + \left(\frac{Z_0}{2 \cdot X_C}\right)^2\right] \quad (4)$$

$$ISO = 20 \cdot \log_{10}\left[1 + \left(\frac{Z_0}{2 \cdot R_S}\right)\right]$$

For multi-throw shunt-connected switches (e.g., the SPDT switch 800 shown in FIG. 7, and greater than double throw), 6 dB can be added to the isolation figure.

Among other operating characteristics, the forward resistances and capacitances of each of the PIN diodes 814 and 816 are functions of the structural characteristics of the PIN diodes 814 and 816, including the "I" region thicknesses. Using the techniques described herein, the switch 800 can be realized monolithically, in a single package, using a combination of one or more PIN diodes with different structural characteristics and "I" region thicknesses. The PIN diodes 814 and 816 can be embodied using a hybrid combination of the PIN diodes shown in FIG. 1A, 4A, 4B, or 5, with PIN diodes of different "I" region thicknesses. For example, the PIN diode 814 can have a thicker "I" region than the PIN diode 816.

While FIG. 7 illustrates a SPDT configuration of the shunt-connected switch 800, the concepts described herein can be extended to have more ports (e.g., up to SP8T or more) and more inputs (e.g., DPDT, etc.). The configurations are also not restricted to one shunt-connected diode per arm. A SPDT switch can include two, three, or more shunt-connected PIN diodes in each arm. Using the concepts described herein, a monolithic, multi-throw shunt-connected switch with any suitable combination of PIN diodes having different "I" region thicknesses can be formed.

A process of fabricating the switch 800 can include one or more of the steps described above with reference to FIG. 1B to form the PIN diodes 814 and 816. Additional process steps can be relied upon to form the capacitors, inductors, transmission lines, bias networks, and other elements shown in FIG. 7. The additional circuit elements can be formed over the intrinsic layer of the PIN diodes 814 and 816. Additional process steps can also be relied upon to form the metal layers and realize the electrical connections between the circuit elements shown in FIG. 7. For example, the steps can include forming at least one metal layer over the intrinsic layer of the PIN diodes 814 and 816 to electrically couple the first PIN diode to a node between the common RF port and the first port of the switch 800 and to electrically couple the second PIN diode to a node between the common RF port and the second port of the switch 800.

Figure 8:
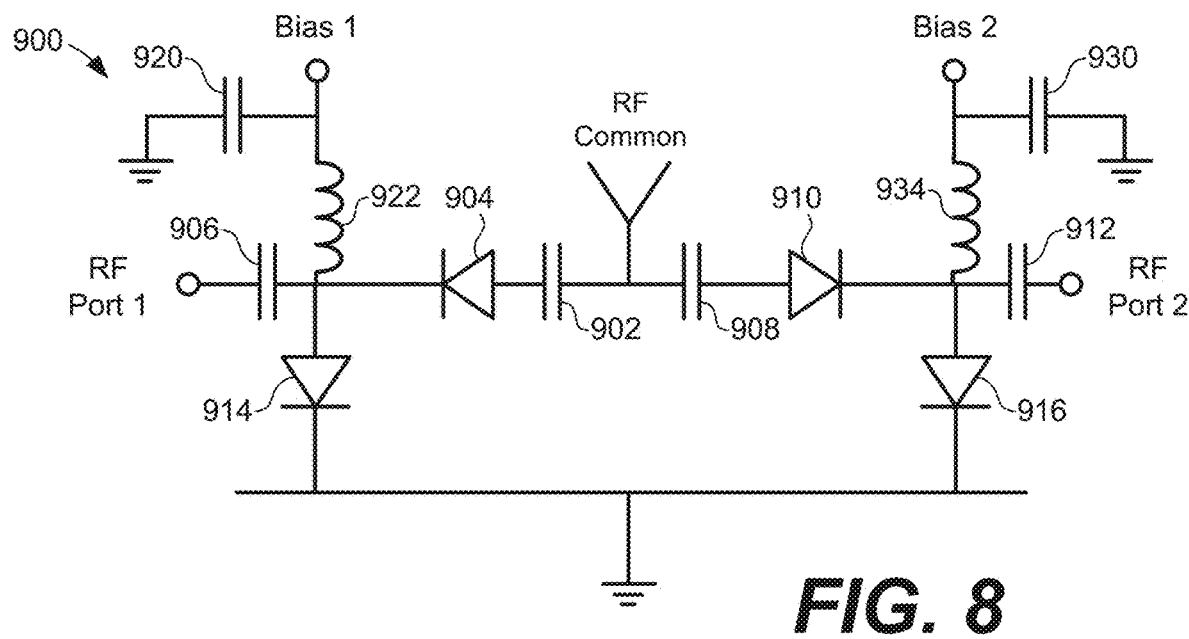
FIG. 8 illustrates an example series-shunt-connected SPDT switch according to various embodiments described herein.

FIG. 8 illustrates an example series-shunt-connected SPDT switch according to various embodiments described herein. The switch 900 is illustrated as a representative example for discussion of the advantages of using a monolithic structure of diodes having different intrinsic regions in the design of a monolithic switch. Other arrangements of series-connected PIN diode switches with additional ports (e.g., series-connected SP3T, SP4T, etc. switches) are within the scope of the embodiments.

As shown in FIG. 8, the switch 900 includes an RF common, a first RF port, a second RF port, a first bias input, and a second bias input. In operation, the switch 900 can either "pass" or "stop" RF signals between the RF common and the first RF port and the second RF port. Particularly, the switch 900 can either pass or stop an RF signal between the RF common and the first RF port based on a voltage bias applied at the first bias input. The switch 900 can also pass or stop an RF signal between the RF common and the second RF port based on a voltage bias applied at the second bias input.

The switch 900 includes a capacitor 902, a PIN diode 904, and a capacitor 906 electrically coupled or connected in series between the RF common and the first RF port. The switch 900 also includes a capacitor 908, a PIN diode 910, and a capacitor 912 connected in series between the RF common and the second RF port. The switch 900 also includes a PIN diode 914 with an anode connected between the PIN diode 904 and the capacitor 806 and a cathode connected to ground. The switch 900 also includes a PIN diode 916 with an anode connected between the PIN diode 910 and the capacitor 912 and a cathode connected to ground. The switch 900 also includes a first bias network, including a capacitor 920 connected from the first bias input to ground and an RF choke 922 connected from the first bias input to a cathode of the PIN diode 904. The switch 900 also includes a second bias network, including a capacitor 930 connected from the second bias input to ground and an RF choke 934 connected from the second bias input to a cathode of the PIN diode 910.

In the switch 900, the PIN diodes 904 and 914 can be placed into a "pass" condition when forward biased and a "stop" condition when reverse biased based on the voltage at the second bias input. Similarly, the PIN diodes 910 and 916 can be placed into a "pass" condition when forward biased and a "stop" condition when reverse biased based on the voltage at the second bias input. When forward biased, each of the PIN diodes 904, 914, 910, and 916 presents a respective low forward resistance, $R_S$. When reverse biased, each of the each of the PIN diodes 904, 914, 910, and 916 presents a high impedance.

It can be difficult to achieve sufficient isolation using a single PIN diode, whether series- or shunt-connected, in an arm of a switch. To overcome this limitation, there are switch designs that employ combinations of series and shunt diodes (e.g., series-shunt-connected or compound switches) and switches that employ resonant structures (e.g., tuned switches) for improved isolation. The series-shunt-connected configuration shown in FIG. 8 is common for this purpose. In the insertion loss state for a compound switch, the series diode is forward biased and the shunt diode is at zero or reverse bias. The reverse is true for the isolation state. This adds some complexity to the bias circuitry in comparison to simple series- or shunt-connected switches.

In series-shunt-connected switches, such as the switch 900, the insertion loss, the power dissipation, and the maximum isolation are functions of both the forward resistance, $R_S$, and the capacitance, $X_C$, of the PIN diodes 904, 914, 910, and 916. The power dissipation or loss is mostly limited by and a function of the forward resistances through the series PIN diodes 904 and 910. In a series-shunt-connected SPST switch, the insertion loss, IL, and the isolation, ISO, are given (in dB) by:

$$IL = 10 \cdot \log_{10}\left[\left(1 + \frac{R_S}{2 \cdot Z_0}\right)^2 + \left(\frac{Z_0 + R_S}{2 \cdot X_C}\right)^2\right] \quad (5)$$

$$ISO = 10 \cdot \log_{10}\left[\left(1 + \frac{Z_0}{2 \cdot R_S}\right)^2 + \left(\frac{X_C}{2 \cdot Z_0}\right)^2 \cdot \left(1 + \frac{Z_0}{R_S}\right)^2\right] \quad (6)$$

Among other operating characteristics, the forward resistances and capacitances of each of the PIN diodes 904, 914, 910, and 916 are functions of the structural characteristics of the PIN diodes 904, 914, 910, and 916, including the "I" region thicknesses. The switch 900 could be implemented with each of the PIN diodes 904, 914, 910, and 916 having the same the "I" region thickness. In that case, the arms of the switch 900 would be symmetric, and the transmit and receive arms would be treated the same. It would have been necessary in a conventional monolithic design for each of the PIN diodes 904, 914, 910, and 916 to have the same the "I" region thickness. However, a compromise must be made between the transmit and receive functions in a symmetric switch because of the single "I" region thickness. Using the techniques described herein, the switch 900 can be realized monolithically, in a single package, using a combination of one or more PIN diodes with different structural characteristics and "I" region thicknesses. The PIN diodes 904, 914, 910, and 916 can be embodied using a hybrid combination of the PIN diodes shown in FIG. 1A, 4A, 4B, or 5, with PIN diodes of different "I" region thicknesses. Once a specific arm in the switch 900 is chosen for the transmit or receive function, the "I" region thickness in the respective arm can be optimized for radio frequency performance, by tailoring the "I" region thickness for junction capacitance, anode area, reverse breakdown, series resistance, any combination of those characteristics, or other electrical characteristics.

As presented in equations (1)-(6), the series on-resistance, $R_S$, and the off-state capacitance, $X_C$, leads to basic equations for the insertion loss IL and isolation ISO of each switch topology, with the assumption that $R_S$ and $X_C$ of the series and shunt PIN diodes in each arm are identical. Equations (1)-(5) are first-order approximations and do not include interconnect parasitics, nor the effect of adding multiple arms to the switch. In practical designs, these secondary effects must be accounted for, and the advantage of quarter wave transformations in the case of shunt diode designs and impedance matching can be accounted for in all cases.

Examining the effect of the on-resistance characteristic of a typical active element, it can be demonstrated by equation (1) that for a series-only configured switch, the insertion loss IL is dependent entirely on the value of the on-resistance and the off-state total output capacitance is essentially decoupled from the switch insertion loss. For a series-shunt configured switch, the output capacitance does play a role, but the examination of equation (5) reveals that it is also dominated by the device on-state series resistance. As another way of viewing this series resistance dependence for series configured switches, the RF energy in the "on" arm is flowing through the active element. It can be seen from equations (1)-(5) that the insertion loss and, in direct proportion, the RF power handling is limited by the losses and dissipation in this series element.

A similar evaluation can be made shunt-only configured switches, as shown in equation (3). In this case the RF energy in the "on" arm is not flowing through the active device, but instead is being transferred from input to output through low loss, high "Q" transmission lines. In this case the RF dissipation is primarily due to $I^2R$ losses in the metallic conductors with the active blocking element being DC reverse biased in an off-state. The insertion loss in this shunt configuration, as expressed in equation (3), is limited only by the output shunt capacitance. For multi-throw switch configurations, the loss in the quarter wave transformers needs to provide isolation between switch arms, and the IL will result in low values even for active device structures that have significant series on-resistance. A difficulty in this shunt-only switch configuration, as can be seen in equation (4), is that a high on-state resistance will result in degraded isolation ISO. If the forward on resistance is too high, the isolation in each switch arm may be so poor as to render the switch unusable.

Using these simplified assumptions in equations (1)-(4), it can be seen that for series-only and shunt-only switch optimizations of the series on-resistance and the off-state capacitance can dramatically alter high frequency switch performance. For existing PIN diode monolithic switch designs which can only employ a single "I" region thickness, this optimization of the individual active elements can only be accomplished by modifying the active area (anode) of the PIN structure. The embodiments described herein change that paradigm by allowing each discrete PIN diode to be individually adjusted by allowing the specific "I" region thickness to be modified.

In the series-shunt configuration, it is often found that the high frequency switch performance is improved by having the series and shunt elements in each arm having differing areas thus modifying the series resistance and the off-state capacitance. With existing monolithic designs an area change is the only way to affect these changes. The embodiments described herein, with various PIN diodes having multi-thickness "I" regions, provides an additional optimization factor for monolithic solutions.

While FIG. 8 illustrates a SPDT configuration of the switch 900, the concepts described herein can be extended to have fewer ports (e.g., a series-shunt-connected SPST switch) or more ports (e.g., up to SP8T or more). The concepts can also be extended to have more inputs (e.g., DPDT, etc.). The configurations are also not restricted to one pair of series-shunt-connected diodes per arm. A series-shunt-connected switch can include two, three, or more series-shunt-connected PIN diodes in each arm. Using the concepts described herein, a monolithic, multi-throw shunt-connected switch with any suitable combination of PIN diodes having different "I" region thicknesses can be formed.

A process of fabricating the switch 900 can include one or more of the steps described above with reference to FIG. 1B to form the PIN diodes 904, 914, 910, and 916. Additional process steps can be relied upon to form the capacitors, inductors, transmission lines, bias networks, and other elements shown in FIG. 8. The additional circuit elements can be formed over the intrinsic layer of the PIN diodes 904, 914, 910, and 916. Additional process steps can also be relied upon to form the metal layers and realize the electrical connections between the circuit elements shown in FIG. 8.

Figure 9:
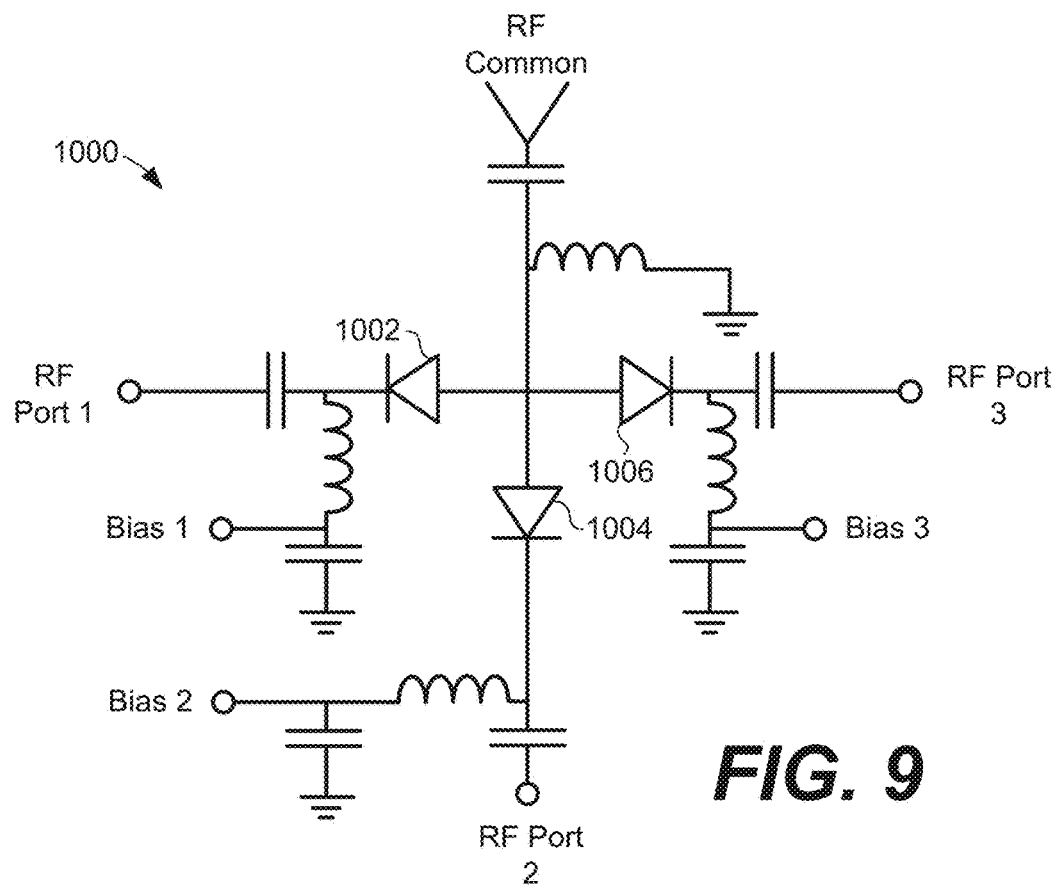
FIG. 9 illustrates an example series-connected TEE SP3T switch according to various embodiments described herein.

FIG. 9 illustrates an example series-connected TEE SP3T switch 1000 according to various embodiments described herein. The switch 1000 is illustrated as a representative example for discussion of the advantages of using a monolithic structure of diodes having different intrinsic regions in the design of a monolithic switch. Other arrangements with additional ports (e.g., series-connected TEE SP4T, etc. switches) are within the scope of the embodiments.

As shown in FIG. 9, the switch 1000 includes an RF common, a first RF port, a second RF port, a third RF port, a first bias input, a second bias input, and a third bias input. The switch 1000 a first PIN diode 1002 in series between the RF common and the first RF port, a second PIN diode 1004 in series between the RF common and the second RF port, and a third PIN diode 1006 in series between the RF common and the third RF port. The switch 1000 also includes bias networks for the first, second, and third, bias inputs as shown in FIG. 9. In operation, the switch 1000 can either "pass" or "stop" RF signals between the RF common and the RF ports based on voltage biases applied at the first, second, and third bias inputs.

Among other operating characteristics, the forward resistances and capacitances of each of the PIN diodes 1002, 1004, and 1006 are functions of the structural characteristics of the PIN diodes 1002, 1004, and 1006, including the "I" region thicknesses. The switch 1000 could be implemented with each of the PIN diodes 1002, 1004, and 1006 having the same the "I" region thickness. In that case, the arms of the switch 1000 would be symmetric, and the transmit and receive arms would be treated the same. It would have been necessary in a conventional monolithic design for each of the PIN diodes 1002, 1004, and 1006 to have the same the "I" region thickness. However, a compromise must be made between the transmit and receive functions in a symmetric switch because of the single "I" region thickness. Using the techniques described herein, the switch 1000 can be realized monolithically, in a single package, using a combination of one or more PIN diodes with different structural characteristics and "I" region thicknesses. Once a specific arm in the switch 1000 is chosen for the transmit or receive function, the "I" region thickness in the respective arm can be optimized for radio frequency performance, by tailoring the "I" region thickness for junction capacitance, anode area, reverse breakdown, series resistance, any combination of those characteristics, or other electrical characteristics.

The PIN diodes 1002, 1004, and 1006 can be embodied using a hybrid combination of the PIN diodes shown in FIG. 1A, 4A, 4B, or 5, with PIN diodes of different "I" region thicknesses. For example, the PIN diode 1002 can have a thicker "I" region than the PIN diode 1004, and the PIN diode 1004 can have a thicker "I" region than the PIN diode 1006.

A process of fabricating the switch 1000 can include one or more of the steps described above with reference to FIG. 1B to form the PIN diodes 1002, 1004, and 1006. Additional process steps can be relied upon to form the capacitors, inductors, transmission lines, bias networks, and other elements shown in FIG. 9. The additional circuit elements can be formed over the intrinsic layer of the PIN diodes 1002, 1004, and 1006. Additional process steps can also be relied upon to form the metal layers and realize the electrical connections between the circuit elements shown in FIG. 9.

Figure 10:
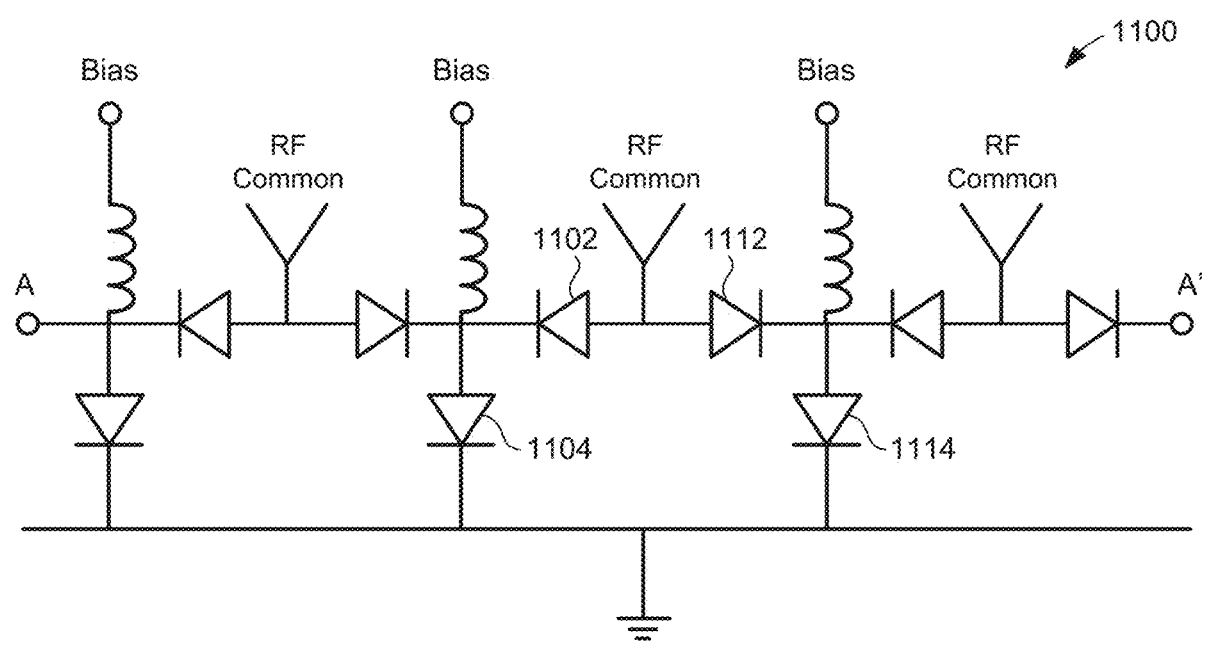
FIG. 10 illustrates an example series-shunt-connected ring switch according to various embodiments described herein.

FIG. 10 illustrates an example series-shunt-connected ring switch 1100 according to various embodiments described herein. As shown in FIG. 10, the switch 1100 includes three RF common ports and three bias inputs. In operation, the switch 1100 can either "pass" or "stop" RF signals between the RF common ports based on voltage biases applied at the bias inputs.

In the switch 1100, the node "A" can be electrically coupled to the node "A'," for a ring switch having three arms. However, the switch 1100 can be extended to include any number of arms in the ring configuration. Among other components, one arm of the switch 1100 includes a series-shunt-connection among PIN diodes 1102 and 1104 and a series-shunt-connection among PIN diodes 1112 and 1114. When forward biased, each of the PIN diodes 1102, 1104, 1112, and 1114 presents a respective low forward resistance, $R_S$. When reverse biased, each of the each of the PIN diodes 1102, 1104, 1112, and 1114 presents a high impedance.

For series-shunt-connected switches, such as in switch 1100, the insertion loss, the power dissipation, and the maximum isolation are functions of both the forward resistance, $R_S$, and the capacitance, $X_X$, of the PIN diodes 1102, 1104, 1112, and 1114. The power dissipation or loss is mostly limited by and a function of the forward resistances through the series PIN diodes 1102, 1104, 1112, and 1114. Among other operating characteristics, the forward resistances and capacitances of each of the PIN diodes 1102, 1104, 1112, and 1114 are functions of the structural characteristics of the PIN diodes 1102, 1104, 1112, and 1114, including the "I" region thicknesses. Using the techniques described herein, the switch 1100 can be realized monolithically, in a single package, using a combination of one or more PIN diodes with different structural characteristics and "I" region thicknesses. The PIN diodes 1102, 1104, 1112, and 1114 can be embodied using a hybrid combination of the PIN diodes shown in FIG. 1A, 4A, 4B, or 5, with PIN diodes of different "I" region thicknesses.

A process of fabricating the switch 1100 can include one or more of the steps described above with reference to FIG. 1B to form the PIN diodes 1102, 1104, 1112, and 1114. Additional process steps can be relied upon to form the capacitors, inductors, transmission lines, bias networks, and other elements shown in FIG. 10. The additional circuit elements can be formed over the intrinsic layer of the PIN diodes 1102, 1104, 1112, and 1114. Additional process steps can also be relied upon to form the metal layers and realize the electrical connections between the circuit elements shown in FIG. 10.

The switches shown in FIGS. 6-10 are provided as examples, and other switch topologies are within the scope of the embodiments. The structures and methods described herein can be used to fabricate a wide variety of useful integrated circuits, such as switches, limiters, and other devices. Particularly, combinations of the PIN and NIP diodes described above, with various "I" region thicknesses, can be integrated with various components (e.g., blocking capacitors, transmission lines, RF chokes, resistors, etc.) in a monolithic circuit format suitable for switches, limiters, and other devices in microwave circuit applications.

The features of the embodiments described herein are representative and, in alternative embodiments, certain features and elements can be added or omitted. Additionally, modifications to aspects of the embodiments described herein can be made by those skilled in the art without departing from the spirit and scope of the present invention defined in the following claims, the scope of which are to be accorded the broadest interpretation so as to encompass modifications and equivalent structures.

Therefore, the following is claimed:

1. A monolithic multi-throw diode switch, comprising:
    a common port, a first port, and a second port of the multi-throw diode switch;
    an intrinsic layer comprising an upper surface;
    a first PIN diode comprising a first P-type region formed, from the upper surface of the intrinsic layer, to a first depth into the intrinsic layer such that the first PIN diode comprises a first effective intrinsic region of a first thickness, the first PIN diode being electrically coupled to a node between the common port and the first port;
    a second PIN diode comprising a second P-type region formed, from the upper surface of the intrinsic layer, to a second depth into the intrinsic layer such that the second PIN diode comprises a second effective intrinsic region of a second thickness, the second PIN diode being electrically coupled to a node between the common port and the second port;
    a first bias network for bias control of the first PIN diode; and
    a second bias network for bias control of the second PIN diode, wherein:
    the second depth of the second P-type region is greater than the first depth of the first P-type region.

2. The monolithic multi-throw diode switch of claim 1, wherein the first thickness is greater than the second thickness.

3. The monolithic multi-throw diode switch of claim 1, further comprising at least one capacitor and at least one inductor formed over the intrinsic layer as part of the monolithic multi-throw diode switch.

4. The monolithic multi-throw diode switch of claim 1, further comprising at least one transmission line formed over the intrinsic layer as part of the monolithic multi-throw diode switch.

5. The monolithic multi-throw diode switch of claim 1, wherein:
    the first PIN diode is series-connected in the node between the common port and the first port; and
    the second PIN diode is series-connected in the node between the common port and the second port.

6. The monolithic multi-throw diode switch of claim 1, wherein:
    the first PIN diode is shunt-connected from the node between the common port and the first port to ground; and the second PIN diode is shunt-connected from the node between the common port and the second port to ground.

7. The monolithic multi-throw diode switch of claim 1, wherein:
    the first PIN diode is series-connected in the node between the common port and the first port; and
    the second PIN diode is shunt-connected from a cathode of the first PIN diode to ground.

8. The monolithic multi-throw diode switch of claim 1, further comprising:
    a dielectric layer over the intrinsic layer, the dielectric layer comprising a plurality of openings, wherein:
    the first P-type region is formed through a first opening among the plurality of openings; and
    the second P-type region is formed through a second opening among the plurality of openings.

9. The monolithic multi-throw diode switch of claim 8, wherein a first width of the first opening is different than a second width of the second opening.

10. The monolithic multi-throw diode switch of claim 1, further comprising an insulator between the first PIN diode and the second PIN diode.

11. The monolithic multi-throw diode switch of claim 1, further comprising a third PIN diode comprising a third P-type region formed to a third depth into the intrinsic layer such the third PIN diode comprises a third effective intrinsic region of a third thickness.

12. The monolithic multi-throw diode switch claim 11, wherein:
    the first thickness is greater than the second thickness; and
    the second thickness is greater than the third thickness.

13. The monolithic multi-throw diode switch of claim 1, further comprising an N-type silicon substrate, wherein the first PIN diode and the second PIN diode are both formed on the N-type silicon substrate.

14. The monolithic multi-throw diode switch of claim 1, further comprising:
    a dielectric layer over the intrinsic layer, the dielectric layer comprising a plurality of openings, wherein:
    the first P-type region is formed through a first opening among the plurality of openings;
    the second P-type region is formed through a second opening among the plurality of openings; and
    a first width of the first opening is different than a second width of the second opening.

15. A monolithic multi-throw diode switch, comprising:
    a common port, a first port, and a second port of the multi-throw diode switch;
    an intrinsic layer comprising an upper surface;
    a first PIN diode comprising a first P-type region formed, from the upper surface of the intrinsic layer, to a first depth into the intrinsic layer such that the first PIN diode comprises a first effective intrinsic region of a first thickness, the first PIN diode being electrically coupled to a node between the common port and the first port; and
    a second PIN diode comprising a second P-type region formed to a second depth, from the upper surface of an intrinsic layer, into the intrinsic layer such that the second PIN diode comprises a second effective intrinsic region of a second thickness, the second PIN diode being electrically coupled to a node between the common port and the second port, wherein:
    the first thickness of the first effective intrinsic region is greater than the second thickness of the second effective intrinsic region; and the second depth of the second P-type region is greater than the first depth of the first P-type region.

16. The monolithic multi-throw diode switch of claim 15, further comprising:
 a first bias network for bias control of the first PIN diode; and
 a second bias network for bias control of the second PIN diode.

17. The monolithic multi-throw diode switch of claim 15, further comprising at least one capacitor, at least one inductor, and at least one transmission line formed over the intrinsic layer.

18. The monolithic multi-throw diode switch of claim 15, wherein:
 the first PIN diode is series-connected in the node between the common port and the first port; and
 the second PIN diode is series-connected in the node between the common port and the second port.

19. The monolithic multi-throw diode switch of claim 15, wherein:
 the first PIN diode is shunt-connected from the node between the common port and the first port to ground; and
 the second PIN diode is shunt-connected from the node between the common port and the second port to ground.

20. The monolithic multi-throw diode switch of claim 15, wherein:
 the first PIN diode is series-connected in the node between the common port and the first port; and
 the second PIN diode is shunt-connected from a cathode of the first PIN diode to ground.

* * * * *